US008569739B2

(12) United States Patent
Kim et al.

(10) Patent No.: US 8,569,739 B2
(45) Date of Patent: Oct. 29, 2013

(54) CHEMICALLY-ETCHED NANOSTRUCTURES AND RELATED DEVICES

(75) Inventors: Seheon Kim, Pasadena, CA (US); Axel Scherer, Woodstock, VT (US); Jingqing Huang, Pasadena, CA (US); Dong Yoon Oh, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 88 days.

(21) Appl. No.: 13/314,688

(22) Filed: Dec. 8, 2011

(65) Prior Publication Data

US 2012/0153260 A1 Jun. 21, 2012

Related U.S. Application Data

(60) Provisional application No. 61/423,711, filed on Dec. 16, 2010, provisional application No. 61/522,388, filed on Aug. 11, 2011.

(51) Int. Cl.
*H01L 29/06* (2006.01)
*H01L 31/00* (2006.01)

(52) U.S. Cl.
USPC .......................................................... 257/14

(58) Field of Classification Search
USPC .................. 372/46.01, 9, 20, 29.013, 29.015, 372/38.05, 39, 44.01, 81, 87; 257/81, 82, 257/91, 98, 100, 99, 116, 117, 432–437, 257/749, E33.056–E33.059, E25.032, 186, 257/E31.005, 457, 459, E29.069–E29.071, 257/E29.245, E49.001–E49.004, E21.404; 438/25–28, 51, 55, 64–68, 83, 98
See application file for complete search history.

(56) References Cited

U.S. PATENT DOCUMENTS

| 7,830,936 | B2 * | 11/2010 | Robinson et al. | 372/38.07 |
| 2008/0218740 | A1 * | 9/2008 | Williams et al. | 356/72 |
| 2008/0310470 | A1 * | 12/2008 | Ooi et al. | 372/44.01 |
| 2009/0034566 | A1 | 2/2009 | Noda et al. | |

(Continued)

FOREIGN PATENT DOCUMENTS

| KR | 10-2008-0017331 | 2/2006 |
| WO | 93/23902 | 11/1993 |
| WO | 2006/017485 | 2/2006 |

OTHER PUBLICATIONS

Yablonovitch, E., Inhibited Spontaneous Emission in Solid-State Physics and Electronics, Physical Review Letters 1987, 58: 2059-2062.

(Continued)

*Primary Examiner* — Dao H Nguyen
*Assistant Examiner* — Tram H Nguyen
(74) *Attorney, Agent, or Firm* — Steinfl & Bruno, LLP

(57) ABSTRACT

A method of etching active quantum nanostructures provides the step of laterally etching of an intermediate active quantum nanostructure layer interposed between cladding layers. The lateral etching can be carried out on at least one side of the intermediate active quantum nanostructure layer selectively, with respect to the cladding layers to define at least one lateral recess or spacing in the intermediate active quantum nanostructure layer and respective lateral protrusions of cladding layers protruding with respect to the intermediate active quantum nanostructure layer. This method can be applied to create devices including active quantum nanostructures such as, for example, three-dimensional photonic crystals, a photonic crystal double-slab and a photonic crystal laser.

24 Claims, 25 Drawing Sheets

(56) References Cited

U.S. PATENT DOCUMENTS

| | | | |
|---|---|---|---|
| 2009/0201960 A1 | 8/2009 | Numata et al. | |
| 2012/0049154 A1* | 3/2012 | Schubert | 257/13 |
| 2012/0056232 A1* | 3/2012 | Fujimoto et al. | 257/99 |
| 2012/0273911 A1* | 11/2012 | Shigeta et al. | 257/432 |

OTHER PUBLICATIONS

Maldovan, M., et al., Diamond-structured photonic crystals, Nature Materials 2004, 3: 593-600.

Yablonovitch, E., et al., Photonic Band Structure: The face-centered-cubic case employing nonspherical atoms, Physical Review Letters 1991, 67: 2295-2299.

Lin, SY., et al., A three-dimensional photonic crystal operating at infrared wavelengths, Nature 1998, 394: 251-253.

Noda, S., et al., Full Three-Dimensional Photonic Bandgap Crystals at Near-Infrared Wavelengths, Science 2000, 289: 604-606.

Takahashi, S., et al., Direct creation of three-dimensional photonic crystals by a top-down approach, Nature Materials 2009, 8: 721-725.

Luo, C., et al., All-angle negative refraction in a three-dimensionally periodic photonic crystal, Applied Physics Letters 2002, 81: 2352-2354.

Smith, DR., et al., Metamaterials and Negative Refractive Index, Science 2004, 305: 788-792.

Park, H., et al., Electrically Driven Single-Cell Photonic Crystal Laser, Science 2004, 305: 1444-1447.

Jewell, J., et al., Vertical-Cavity Surface-Emitting Lasers : Design, Growth, Fabrication, Characterization, IEEE J. of Quantum Electronics 1991, 27: 1332-1346.

Seo, M., et al., Low threshold current single-cell hexapole mode photonic crystal laser, AIP 2007, 90: 171122-1-171122-4.

Ellis, B., et al., Ultralow-threshold electrically pumped quantumdot photonic-crystal nanocavity laser, Nature Photonics 2011, 5: 297-300.

Painter, O., et al., Two-Dimensional Photonic Band-Gap Defect Mode Laser, Science 1999, 284: 1819-1821.

Johnson, S., et al., Guided modes in photonic crystal slabs, Physical Review B 1999, 60: 5751-5758.

Ryu, H., et al., High-quality-factor and small-mode-volume hexapole modes in photonic-crystal-slab nanocavities, AIP 2003, 83: 4294-4297.

Ryu, H., et al., High quality-factor whispering-gallery mode in the photonic crystal hexagonal disk cavity, Optical Society of America 2004, 12: 1708-1719.

PCT International Search Report mailed on Jul. 31, 2012 for PCT Application PCT/US2011/064005 filed on Dec. 8, 2011 in the name of California Institute of Technology et al.

PCT Written Opinion mailed on Jul. 31, 2012 for PCT Application PCT/US2011/064005 filed on Dec. 8, 2011 in the name of California Institute of Technology et al.

Chakravarty, S., et al., Electrically injected quantum dot photonic crystal microcavity light emitters and microcavity arrays, J. Phys. D: Appl. Phys. 2007, 40: 2683-2690.

\* cited by examiner

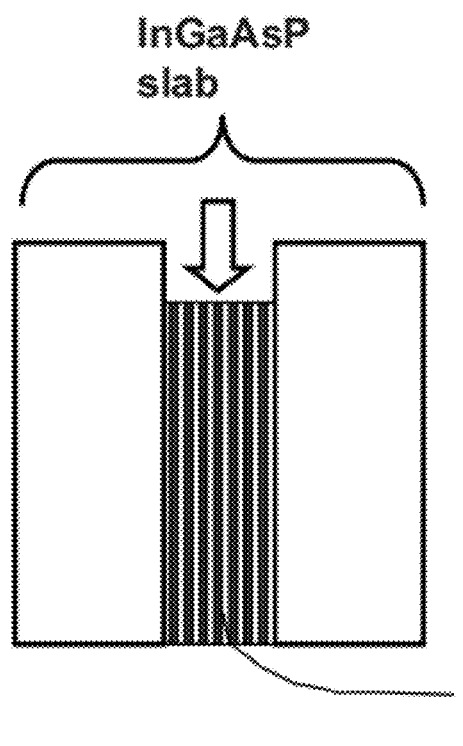
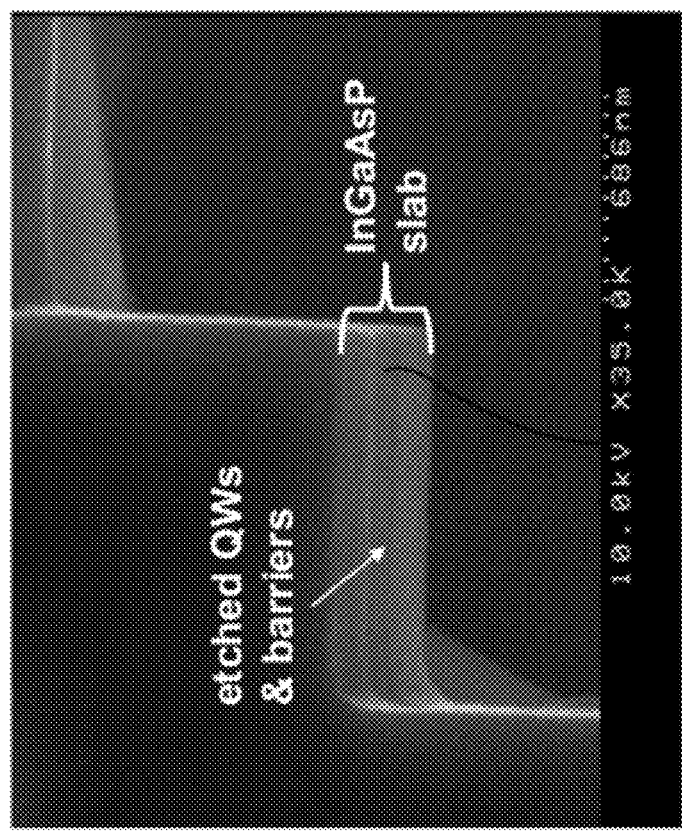
FIG. 3C
FIG. 3B

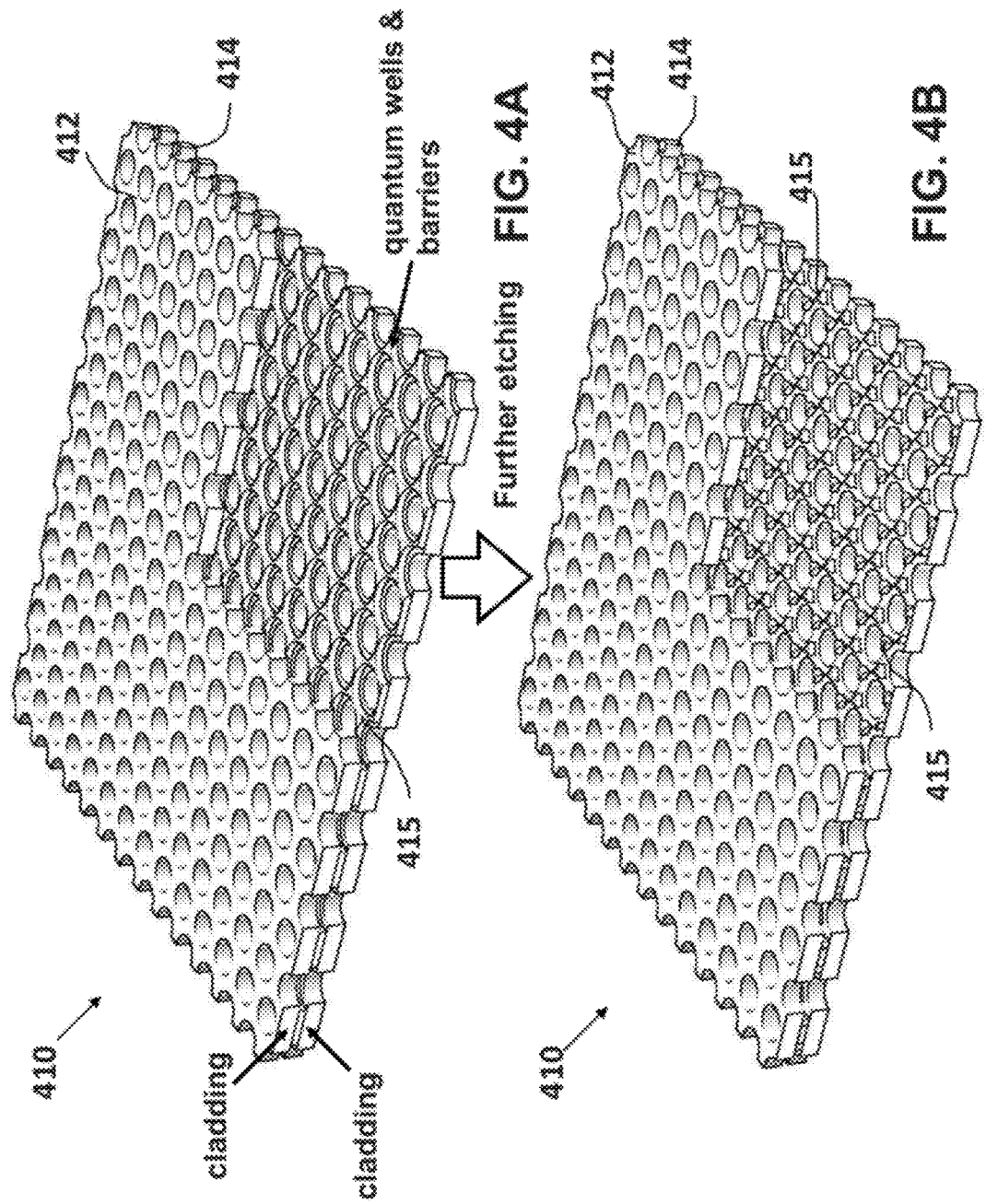

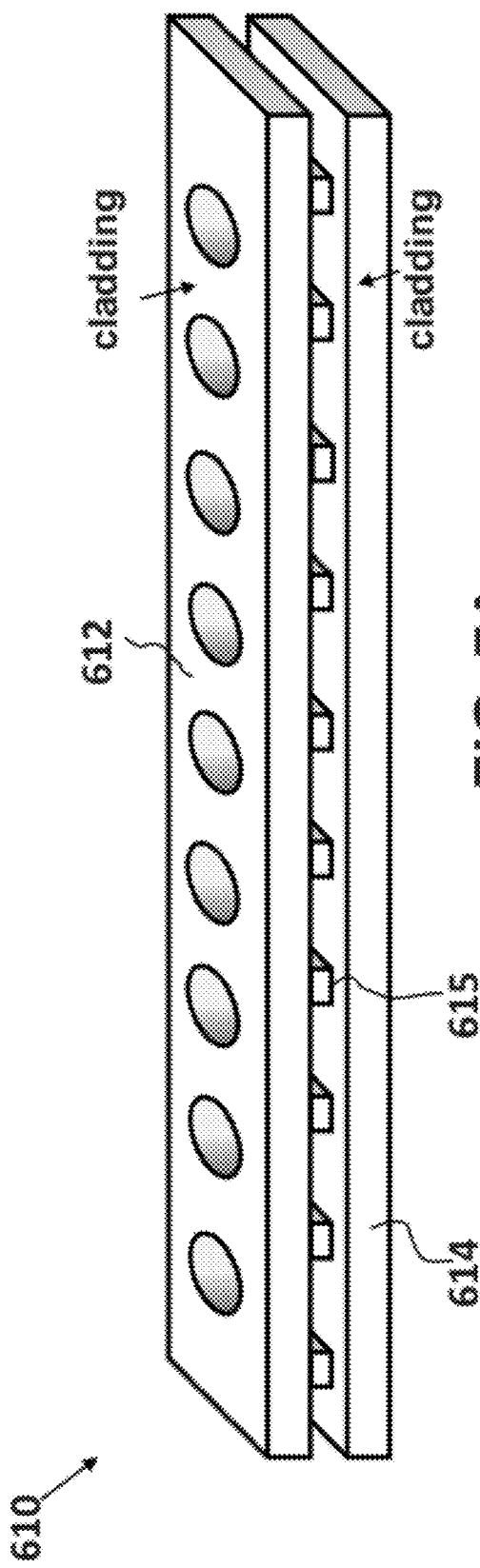
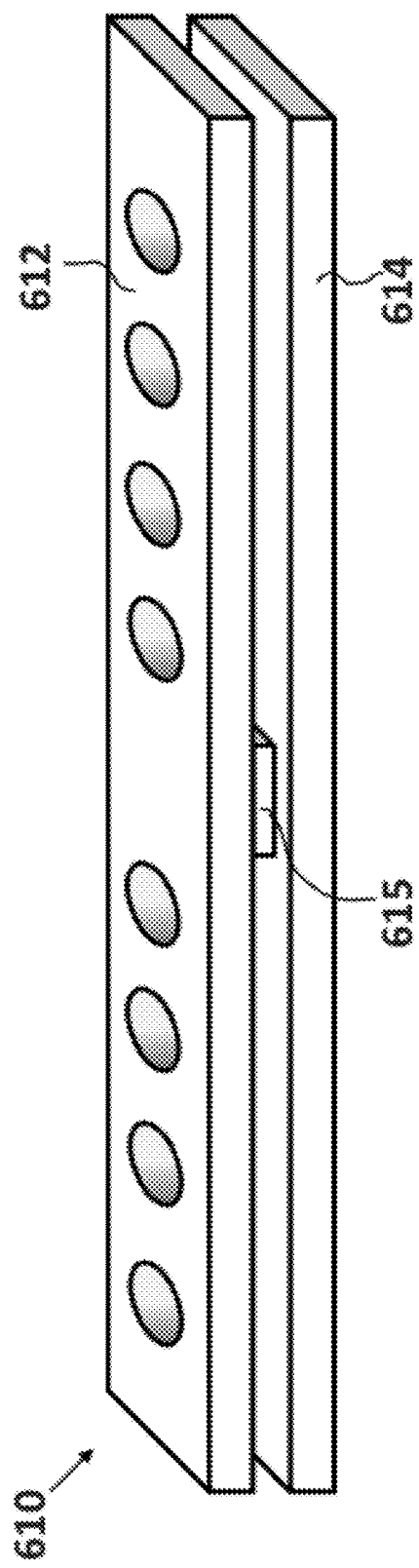

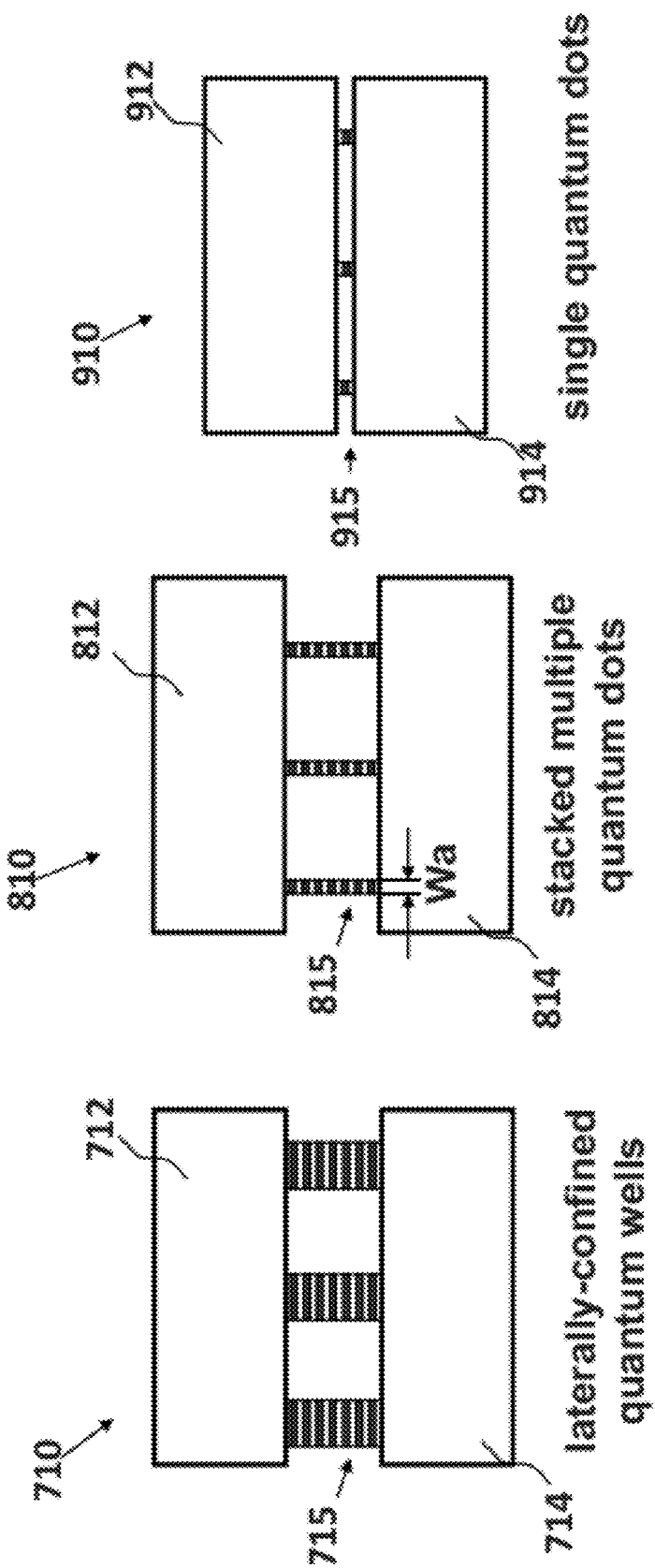

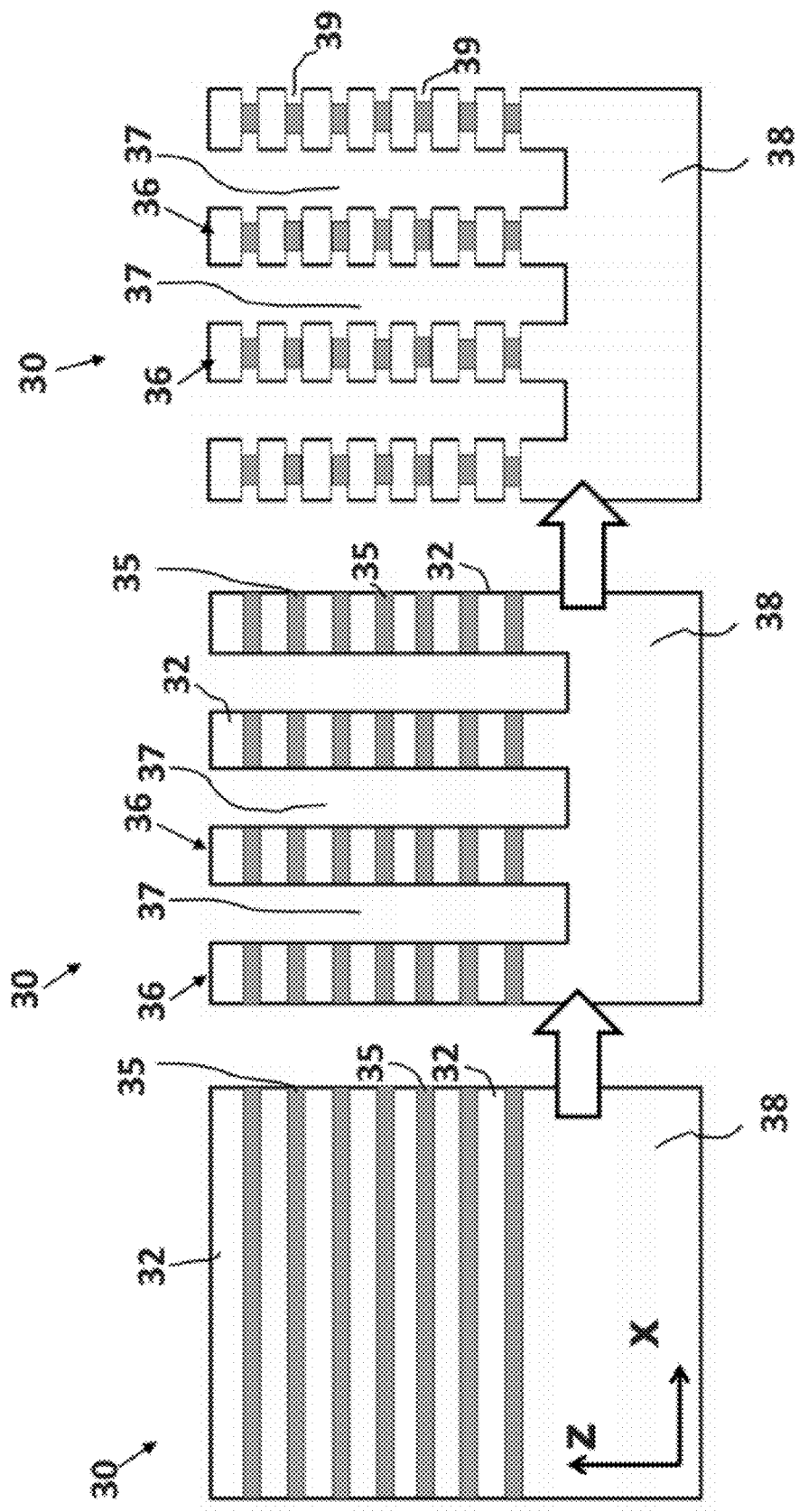

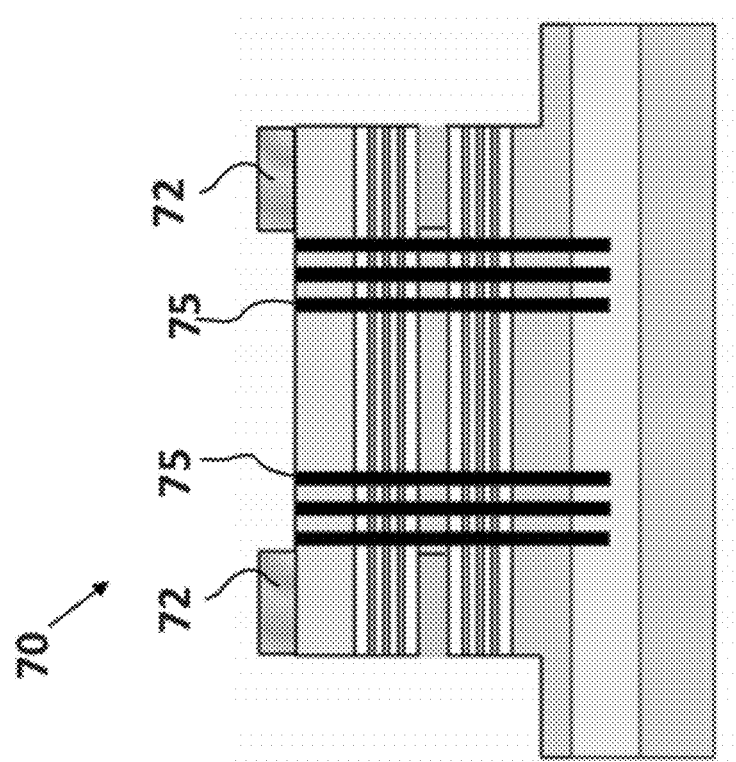
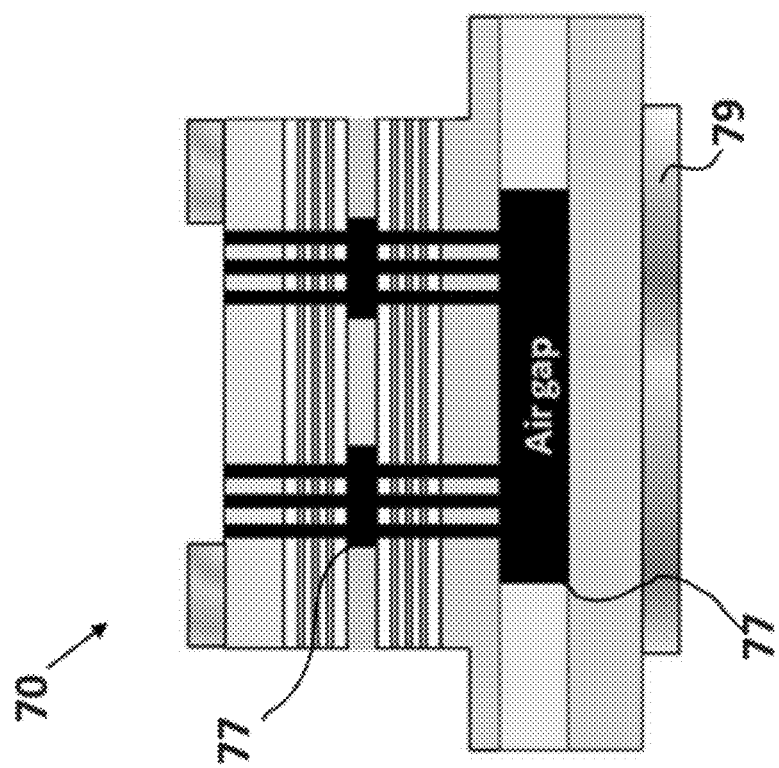
FIG. 20G
FIG. 20H

CHEMICALLY-ETCHED NANOSTRUCTURES AND RELATED DEVICES

CROSS REFERENCE TO RELATED APPLICATIONS

The present application claims priority to U.S. provisional application 61/423,711 for "Chemically-Etched Nanostructures and Related Devices" filed on Dec. 16, 2010 and U.S. provisional application 61/522,388 for "Chemically-Etched Nanostructures and Related Devices" filed on Aug. 11, 2011, both of which are herein incorporated by reference in their entirety.

STATEMENT OF GOVERNMENT GRANT

This invention was made with government support under W911NF-07-1-0277 awarded by the Army. The government has certain rights in the invention.

FIELD

The present disclosure relates to active quantum nanostructures and to a method of creating active quantum nanostructures. In addition, the present disclosure relates devices including active quantum nanostructures such as, for example, three-dimensional photonic crystals and a photonic crystal slab.

BACKGROUND

A semiconductor slab containing multiple quantum wells is widely used in various optoelectronic devices. Examples of such semiconductors include gallium arsenide (GaAs), indium phosphate (InP), and their quaternary system of indium gallium arsenide phosphate ($In_xGa_yAs_{1-y}P_{1-x}$). For the realization of efficient light sources such as lasers and light-emitting-diodes (LEDs), direct bandgap semiconductors are of central importance. In order to control flow of electrons and holes within such semiconductor material composites, precise control of material compositions between three or four elements is important. For example, in the case of a ternary system of $Al_xGa_{1-x}As$, x is varied between 0 and 0.4 to control the bandgap size. On the other hand, in the case of $In_xGa_yAs_{1-y}P_{1-x}$ material system, both x and y are varied to get desired bandgap sizes. One such an exemplary semiconductor with a varying material composition is shown in FIG. 1. It is to be remarked that the stacked layers can be grown using molecular beam epitaxy (MBE) or metal-organic chemical vapor deposition (MOCVD).

In usual optoelectronic applications, cladding layers are designed to have the larger bandgap than those of quantum wells and barriers. A proper doping element may be introduced into the cladding layer to obtain p-type or n-type semiconductor. Their combined structure with a p-n junction enables net current flow under a forward biased condition. As a result, electrons and holes can be confined within the quantum well region and their radiative recombination processes may enable efficient generation of light. In particular, high-performance semiconductor lasers may be obtained based on the wafer design very similar to the one shown in FIG. 1. Subsequent micro- and nano-fabrication procedures involving optical lithography, electron-beam lithography, and dry etching can be used to define optical waveguides and mirrors to form high-quality optical resonators.

A photonic-crystal resonator is one such an example, which can be defined on a high-refractive index semiconductor slab. As shown in FIG. 2A, a photonic-crystal resonator consists of two-dimensionally periodic arrangements of low- and high-refractive index media, where circular holes ($n_{hole}=1.0$) and the semiconductor backbone ($n_{slab}\sim3.5$) provide a highly-reflective minor for electromagnetic waves propagating in the two dimensions. Most of the electromagnetic field's energy can be confined within the intermediate region devoid of such a periodicity, which results in the formation of an optical resonator (See FIG. 2B). This resonator may be fabricated in a semiconductor slab shown in FIG. 1. The optical gain provided by the multiple quantum wells can be used to overcome the optical loss of the resonator, thereby reaching the lasing threshold. The resulting lasing wavelength can be lithographically determined by a lattice constant, 'a', of the photonic-crystal minor. For example, to obtain emission wavelength of ~1.3 μm, 'a' would be in the range of 300 nm-350 nm. Additional fine 'tuning' of the geometries (hole size & position) around the defect region also affect the emission wavelength and the optical loss of the resonator. In general, the thickness of the semiconductor slab, 'T', (see FIG. 1) should be chosen close to the effective half wavelength ($T\sim\lambda/2\, n_{slab}$) to support only the fundamental slab guided modes. For example, for emission wavelength of ~1.3 μm, 'T' would be in the range of 200 nm-250 nm.

SUMMARY

According to a first aspect of the disclosure, a method of etching active quantum nanostructures is described, the method comprising: providing a wafer structure including a first cladding layer and a second cladding layer, the wafer structure further comprising an intermediate active quantum nanostructure layer interposed between the first cladding layer and the second cladding layer; and laterally etching the intermediate active quantum nanostructure layer on at least one side of the intermediate active quantum nanostructure layer selectively with respect to the first cladding layer and second cladding layer to define at least one lateral recess in the intermediate active quantum nanostructure layer and respective lateral protrusions of the first cladding layer and the second cladding layer protruding with respect to the intermediate active quantum nanostructure layer.

According to a second aspect of the present disclosure, a wafer structure is described comprising: a first cladding layer and a second cladding layer; an intermediate active quantum nanostructure layer interposed between the first cladding layer and the second cladding layer; and at least one laterally etched recess made on one side of the wafer structure in the region of the intermediate active quantum nanostructure layer, said lateral etched recess defining a lateral protrusion of the first cladding layer and a lateral protrusion of the second cladding layer protruding with respect to the intermediate active quantum nano structure layer.

According to a third aspect of the present disclosure, a method of creating three-dimensional photonic crystals is described, the method comprising: providing a one-dimensional periodic structure including alternating layers of cladding and sacrificial layers; performing lithography on a top surface of the one-dimensional periodic structure to define two-dimensional photonic crystal patterns, and to obtain a backbone structure including alternating void spaces and walls, each wall including said alternating layers of cladding and sacrificial layers; and laterally etching at least one of said walls to partially remove the sacrificial layers sandwiched between two adjacent cladding layers and to obtain three-dimensional photonic crystals.

According to a fourth aspect of the disclosure, a photonic crystal double slab is described, the photonic crystal double slab comprising two photonic crystal membranes, the two photonic crystal membranes overlapping one another and being spaced apart by means of an intermediate gap.

According to further aspects of the disclosure, a photonic crystal laser, a method for creating a photonic crystal slab and three-dimensional photonic crystals are also described.

Further aspects of the disclosure are shown in the specification, drawings and claims of the present application.

BRIEF DESCRIPTION OF THE DRAWINGS

FIG. 3B shows a scanning electron micrograph showing lateral etching of a quantum well active region.

FIG. 3C shows a cross sectional view of the laterally etched structure shown in FIG. 3B.

FIG. 4A shows a sectional view of an etched active layer based on a two-dimensional photonic-crystal structure.

FIG. 4B shows a cross-sectional view of the structure shown in FIG. 4A after a further etching phase.

FIG. 7A shows a photonic device that can be obtained by a method according to an embodiment of the present disclosure.

FIG. 7B shows a photonic device that can be obtained by a method according to an embodiment of the present disclosure.

FIG. 8A shows laterally-confined stacked quantum wells that can be fabricated by a method according to an embodiment of the present disclosure.

FIG. 8B shows vertically stacked multiple quantum dots that can be fabricated by a method according to an embodiment of the present disclosure.

FIG. 8C shows single quantum dots that can be fabricated by a method according to an embodiment of the present disclosure.

FIGS. 10A-10C show fabrication steps of 3-D photonic crystals according to an embodiment of the present disclosure.

FIGS. 20A-20H show fabrication steps of photonic crystal double-slab laser according to an embodiment of the present disclosure.

DETAILED DESCRIPTION

Figure 1:
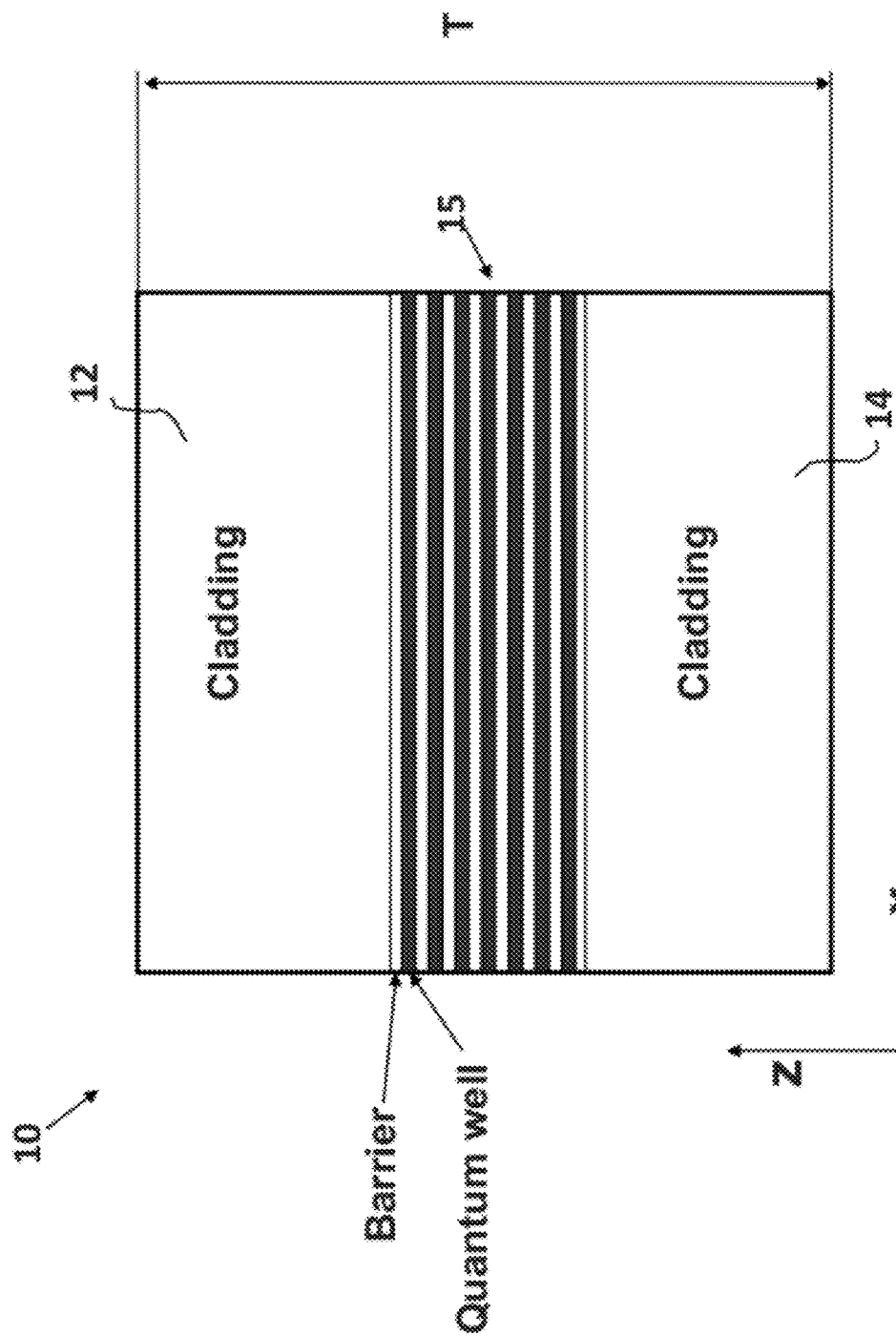
FIG. 1 shows a schematic sectional view of an exemplary (prior art) wafer structure.

Quality factor (Q) is a measure of the optical loss of a given resonator; the higher Q means the better optical confinement. It should be noted that Q in the range of 3,000~10,000 can be easily obtained using photonic-crystal resonators. Mode volume (V) is a measure of how much the electromagnetic energy of a given resonance is spread in space. The resonant mode shown in FIG. 2B has V on the order of $0.5(\lambda/n_{slab})^3$, where $\lambda$ is the resonance wavelength in vacuum. By shrinking the size of a laser while keeping its Q relatively high >1,000, for example, the laser threshold can be greatly reduced in a fundamentally new way. It is a well known fact that an optical mode with high Q and small V (or simply a high Q/V ratio) can strongly alter the spontaneous emission characteristics of an emitter placed inside the resonator. For example, the spontaneous emission lifetime of an exciton pair (the hydrogen-like bound state between an electron and a hole) in a quantum well can be significantly shortened as a result of the enhanced radiative decay preferentially into the resonant mode, which is known as the so-called 'Purcell effect'. Applicants noted that this coupling indeed fosters a laser to start at a reduced threshold pump power.

To obtain sufficiently high Q for a low-threshold lasing, the aforementioned photonic-crystal slab structure should have a low refractive index material as a substrate. Air (or vacuum) is the best medium for it and has the lowest available refractive index of 1.0. Silicon dioxide ($SiO_2$), aluminum oxide ($Al_xO_y$), and sapphire can be used because they have relatively low refractive indices in the range of ~1.5 and also because they have much better thermal conductance than air. However, these oxide materials are very poor electrical conductors and good electrical conductors are usually optically lossy. This has been a major bottleneck in the realization of a current injection photonic-crystal laser. One proposed solution was to form a submicron semiconductor post just below the resonator, which can act as a current flowing wire while it does not degrade Q severely. However, it turns out that the total serial-resistance of the semiconductor post is as high as 2 kΩ, thereby hindering continuous-wave (CW) operation of the laser. Another solution is to introduce the laterally varying doped p-i-n structures, which can allow electrical current to flow 'laterally'. However, the Applicants noted that this method involves several nontrivial steps of wafer re-growth and anisotropic etching.

Another favorable application of this high Q/V photonic-crystal resonator is to build a single-photon source, which can be an essential element for quantum communication scheme in the near future. To accomplish this goal, a single quantum dot should be located well within the defect region to maximize the coupling with an optical resonance. However, its size and location cannot be precisely controlled by using the conventional growing process ('Stranski-Krastanow' method). Thus, one must rely on statistical methods to obtain the correct photonic crystal resonator with its single quantum dot, both spectrally and spatially well matched. For example, one may obtain about 50 useful devices out of 1000 fabricated in the same chip. Such low throughput may become a severe bottleneck for practical applications. Therefore, the Applicants noted that a fundamentally new approach, which enables control of both the sizes and the locations of the dots after completion of a photonic-crystal resonator.

In relation to photonic crystal laser, it is noted by the Applicants that for the last 20 years, researchers have searched various ways to achieve a low-threshold current injection continuous-wave photonic crystal laser at room-temperature. The first electrically-pumped laser based on a photonic crystal cavity was reported in 2004.[1] They adopted a vertically-varying n-i-p doping structure as this had been widely used for already commercialized various semiconductor lasers including VCSELs [2] (Vertical-Cavity Surface-Emitting Lasers). They used selective wet-chemical etching to form a sub-micron size post structure right below the cavity region. The post structure was essential to confine electrical current into the cavity region. However, in order not to spoil the cavity Q too much, the post should be very thin (diameter <500 nm) and relatively long (typically 1 μm). The problem from this design was a very high electrical resistance over 1 kΩ, which had been a major obstacle to continuous-wave lasing operation at room-temperature. So far, continuous-wave operation has not been demonstrated from this class of photonic crystal lasers. [3]

Figure 15:
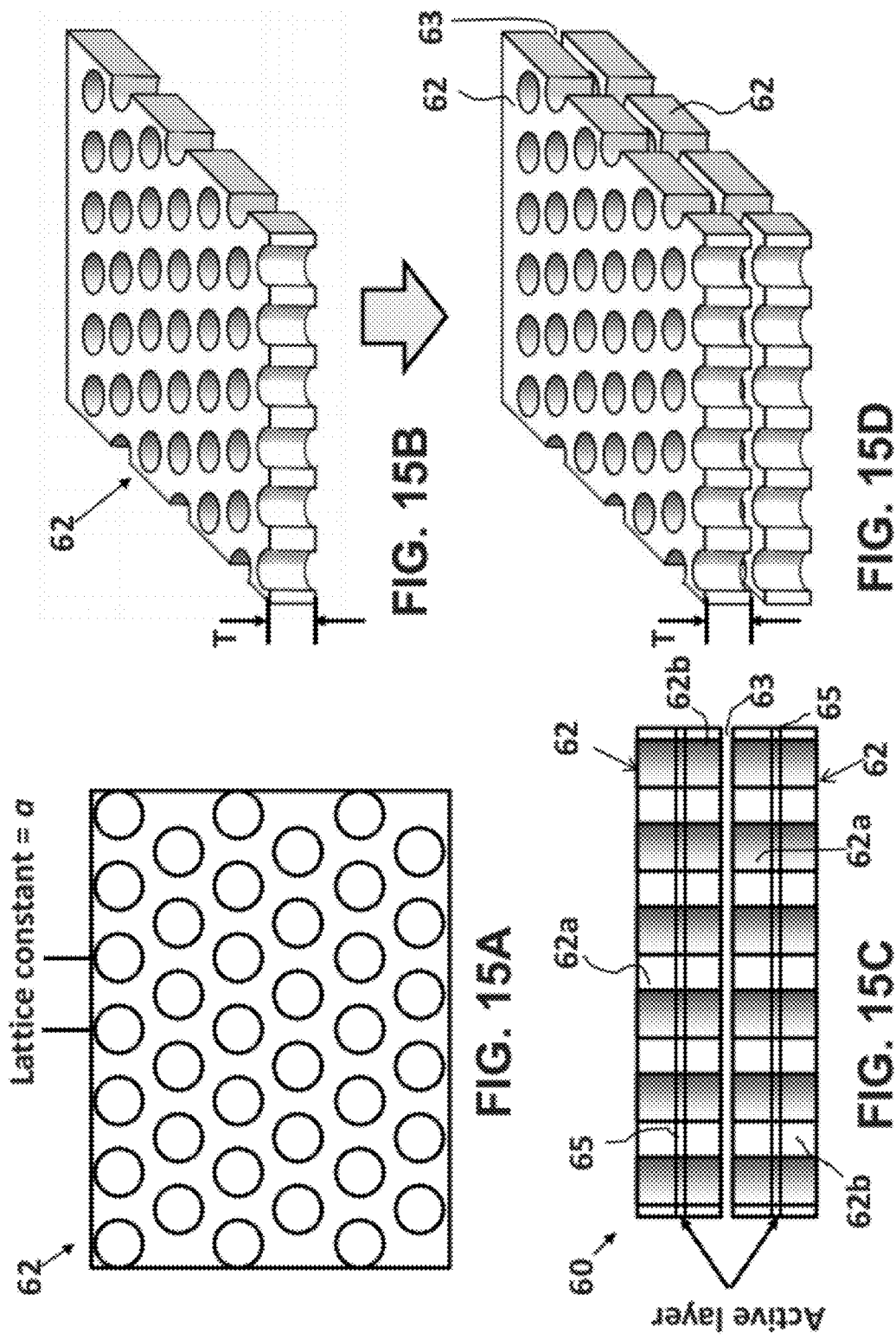
FIGS. 15A-15B show a prior art photonic crystal slab.
FIGS. 15C-15D show a photonic crystal double-slab according to an embodiment of the present disclosure.
Figure 16:
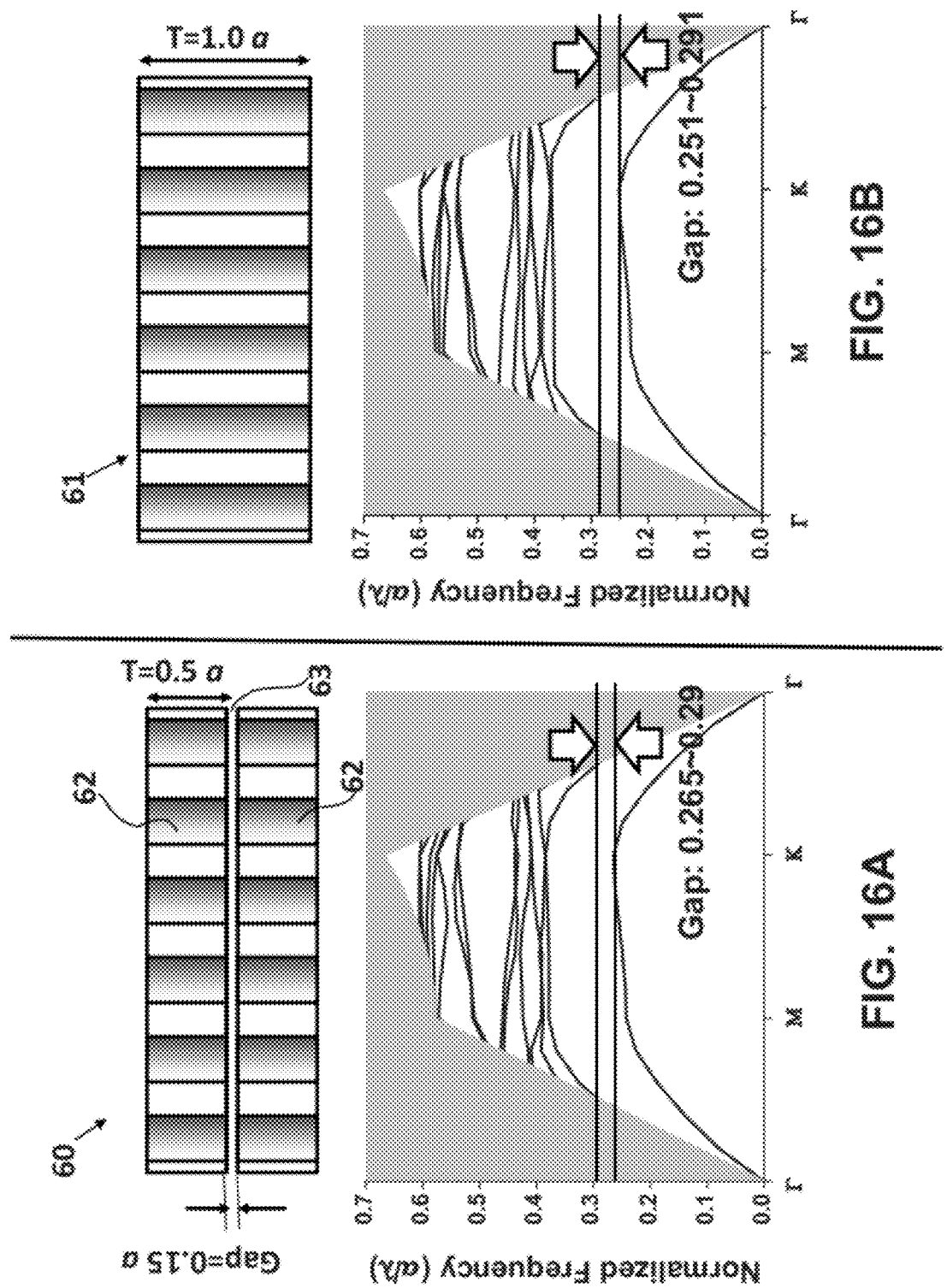
FIG. 16A shows photonic band structures of a double-slab according to an embodiment of the present disclosure.
FIG. 16B shows photonic band structures of a single slab.
Figure 17:
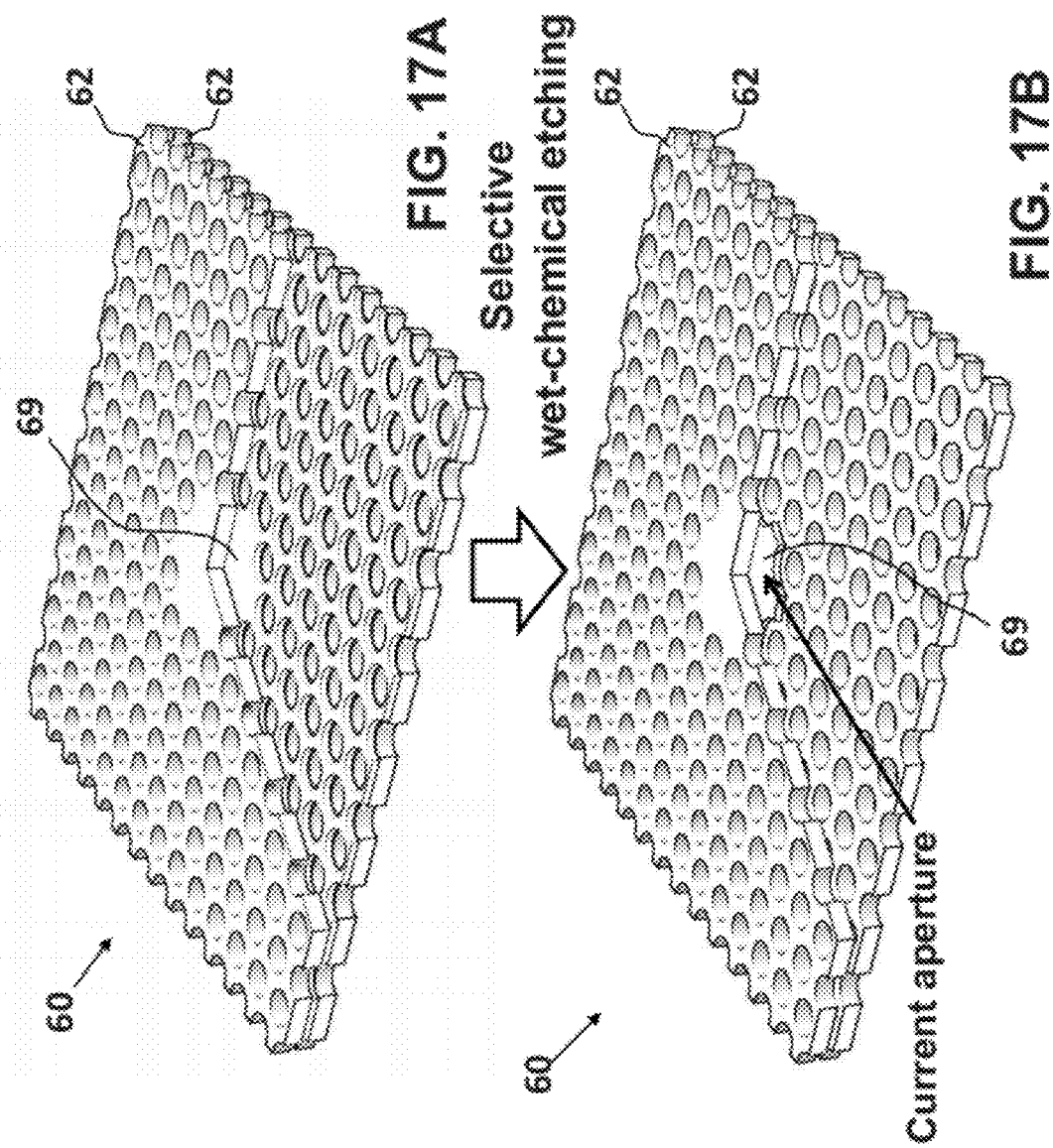
FIGS. 17A-17B shows fabrication steps of a photonic crystal double-slab according to an embodiment of the present disclosure.

To circumvent this problem, laterally-varying p-i-n structures have been adopted in a few recent works. So far, current injection continuous-wave lasing was achieved but at a temperature of ~150 K. [4] The Applicants noted that two potential major drawbacks from this design could be 1) p-, n-doping by ion implantation usually lowers the semiconductor crystal quality. Especially, being exposed to undesirable ion damage, the maximum achievable gain from the active region could be reduced. 2) Laterally-varying p-, n-doped structures may be obtained either by ion implantation or wafer regrowth. However, both of these methods can involve several non-trivial fabrication steps that can be critical to achieve fine mask alignment with respect to a sub-micron size photonic crystal cavity region. On the other hand, with regard to the photonic crystal cavity slab design itself, the Applicants noted that it is interesting to see that almost nothing has been changed from the early proposal. [5] A periodic arrangement of air-holes formed in a 'thin' dielectric slab provides the backbone for laser cavities (See FIG. 15A). It has been well established that the two-dimensional (2-D) photonic crystal can possess a certain frequency range within which any electromagnetic mode cannot propagate along the slab. This frequency region is called 'photonic band gap', which is analogous to the well-known electronic band gap in solid state physics. [6] For telecommunication applications (1.3 μm or 1.55 μm), a typical thickness of such slab could be between 200 nm to 300 nm, assuming an appropriate material for the slab. For some time, it has been believed that the slab thickness should not be changed too much from the aforementioned optimum values. This is because the slab thickness will affect the size of the photonic band gap. [7] If the resulting band gap were too small, it could be very challenging to design a high-Q cavity mode that resides within that small frequency bandwidth. In fact, such restriction on the slab thickness has placed a major obstacle to the design of an electrically-pumped laser. A method of making electrical current flow efficiently through the thin membrane cavity has been a non-trivial technological issue.

In relation to 3-D photonic crystals, such crystals were intensively studied in the early history of photonic crystals because it is a natural conceptual extension of a 3-D periodic atomic structure for electrons. Analogously, the 3-D photonic crystal can possess an energy band gap for photons, which is called 'photonic band gap'. [10] Any propagating photon mode cannot be allowed within such a crystal, when the energy (or frequency) of that photon falls within the spectral region of the band gap. It should be noted that not all 3-D periodic dielectric structures can show the photonic band gap. So far, several 3-D photonic crystal designs possessing complete 3-D photonic band gaps have been known, and it is generally believed that fcc-like symmetry or diamond-like symmetry is more advantageous to having the band gap.[11] One of the pioneers in the field of photonic crystals invented a method to fabricate a 3-D photonic crystal that possesses fcc symmetry, which is named after this pioneer, 'Yablonovite'. [12] This method involves a three-step angled dry-etching process on a flat surface of a semiconductor material. Other well-known 3-D photonic crystal design, a 'wood-pile' structure, [13, 14] required a bottom-up approach, where repeatable wafer bonding processes could be used to stack up photonic crystal layers in the z direction. Recently, it has been found that this wood-pile structure can be fabricated by using a novel two-step angled dry-etching process, known as a top-down approach.[15] Though many interesting applications including lossless optical waveguides and resonators require that 3-D photonic crystals should have photonic band gaps, there are other applications that do not require such properties. One example is 'all-angle negative refraction', which can arise due to the highly dispersive photonic band structure in these 3-D periodic dielectric structures.[16] Though constituent materials forming the 3-D photonic crystal are normal dielectrics, their periodic arrangements in a certain 3-D symmetry can result in unusual light propagation behavior within such a structure. In a broad sense, both 3-D photonic crystal structures with and without photonic band gaps can be categorized into the so-called photonic 'metamaterial', [17] because a new material property (such as photonic band gap or negative refractive index) can be obtained by 'engineering' constituent materials.

With reference to FIGS. 1-21, the present disclosure describes a method of etching active quantum nanostructures. In particular, the active quantum nanostructures include quantum dots, quantum wires, and quantum wells, that can be obtained in the vicinity where they are protected by top and bottom cladding layers. These quantum nanostructures can confine electrons and holes, thereby generating light through the electron-hole recombination process. The shapes and locations of quantum dots, quantum wires and quantum wells may be controlled 'lithographically' with a high precision. In particular, according to an embodiment of the present disclosure, a method of combining selective wet-chemical etching with conventional lithography and dry-etching techniques is described.

Light emission characteristics such as peak emission wavelength and radiative efficiency of active quantum nanostructure are determined by their lateral dimensions, which can be controlled by a wet-chemical etching time. The high radiative recombination efficiency of a certain active nanostructure means that it has a potential as optical gain medium in light-emitting diodes, lasers, and quantum light sources that include a single-photon source. Using the method according to the present disclosure, these materials can be precisely located within a certain high-Q optical resonator, which also means that the remaining area is optically passive. The ability to partition an optical resonator into well-defined gain regions and passive regions would be of great technological importance especially in the design of nanolasers. It follows that unnecessary light absorption by the same quantum nanostructure can be avoided or reduced. Moreover, these self-aligned, isolated active junctions can be used as electrical conduction pathways in current injection type nanolasers.

In addition, with more specific reference to FIGS. 10-14, the present disclosure describes wet-chemical etching that can be used to construct active quantum nanostructures within '2-D' or '1-D' photonic crystal devices. In particular, a method to fabricate '3-D' photonic crystals, in which the spatial periodicity of the crystal can extend to the third dimension (z direction) is described. It is possible to fabricate face-centered-cubic(fcc)-like crystals by adopting one-step angled dry-etching followed by selective wet-chemical etching. It is also shown that a defect region can be formed within such a 3-D photonic crystal, by employing the wafer regrowth process.

In addition, with more specific reference to FIGS. 15-21, the present disclosure describes semiconductor lasers that can utilize periodic arrangements of dielectric structures as a means to confine light within a respective cavity region. The periodic dielectric arrangements are now known as 'photonic crystals.' In particular, a method of making electrically-pumped low-threshold (possibly sub 10 µA) photonic crystal lasers is described. Photonic crystal cavities are defined in a vertically symmetric double-slab, where a stack of quantum wells or quantum dots can provide the required amount of gain for lasing. The double slab can form vertically-varying p-i-n or n-i-p doped layers, where each slab can include the aforementioned active layers. It is possible to fabricate the double slab geometry by using the method of the present disclosure based on dry etching and selective wet-chemical etching. For efficient current confinement, a post structure can be left around the laser cavity during the selective wet-etching process. The thickness of the sacrificial layer sandwiched between the two slabs will determine the resulting thickness of such a post structure (e.g., current aperture), which can be in the range of 20 nm to 100 nm. Therefore, it is expected that the resulting electrical resistance from a current aperture design would not be too high for real practical applications (possibly below 100Ω). In particular, it is found that, with appropriate cavity designs, the cavity quality factor (Q) can be made as high as 60,000 while the mode volume can be kept as small as ~2 $(\lambda/n)^3$, where $\lambda$ is the laser's emission wavelength and 'n' is the refractive index of the slab material. The proposed laser design along with the fabrication method will be of great technological importance in the field of optoelectronics, photonics, and laser physics.

With reference to FIG. 1, an exemplary (prior art) wafer structure (10) that contains a top cladding layer (12) and bottom cladding layer (14) is shown. The wafer structure (10) can include an intermediate layer (15) including multiple quantum well layers and their barrier layers. The size of electronic bandgap in each layer can be controlled by its material composition.

Figure 2A:
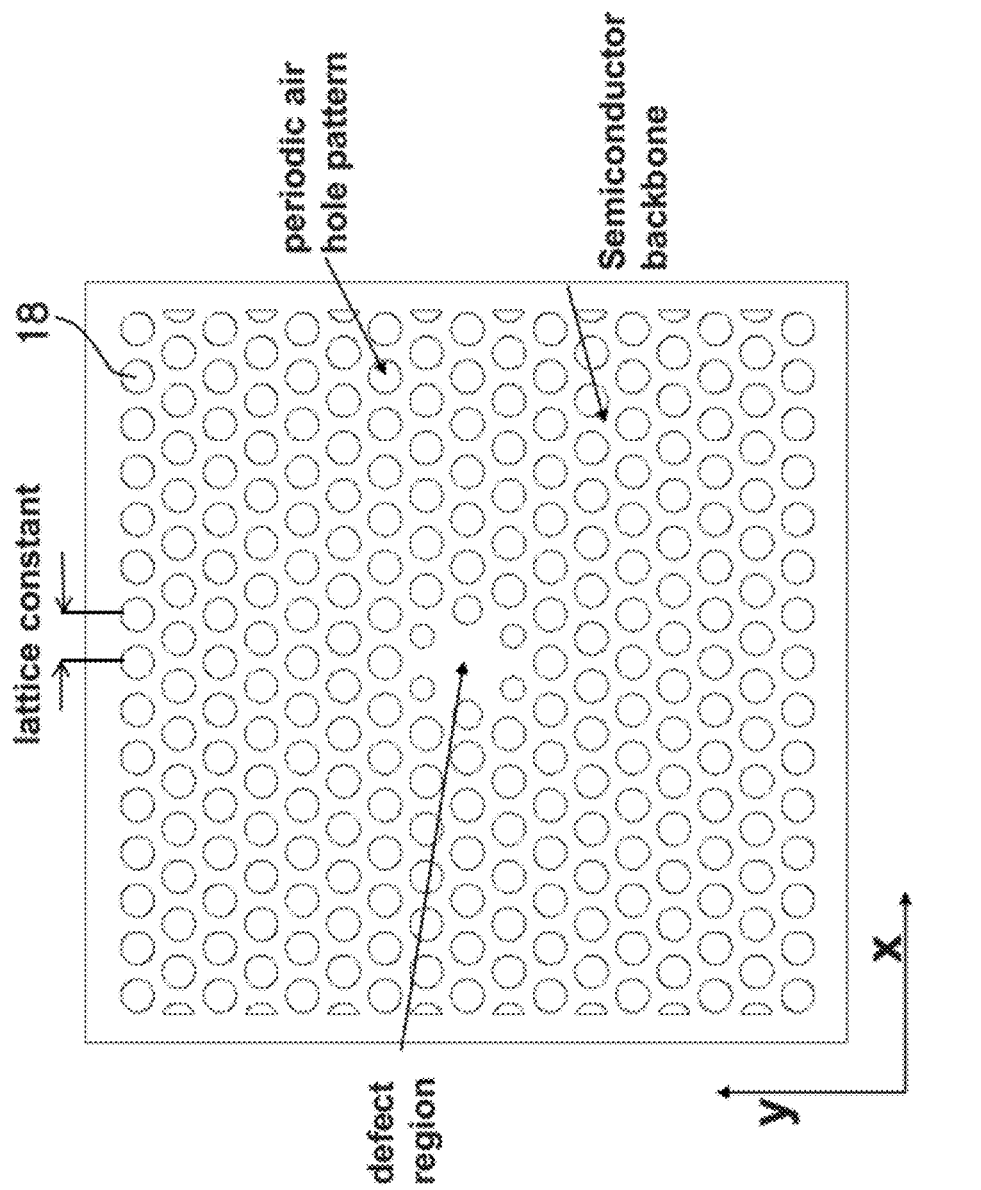
FIG. 2A shows a top view of an exemplary (prior art) photonic-crystal cavity design.
Figure 2B:
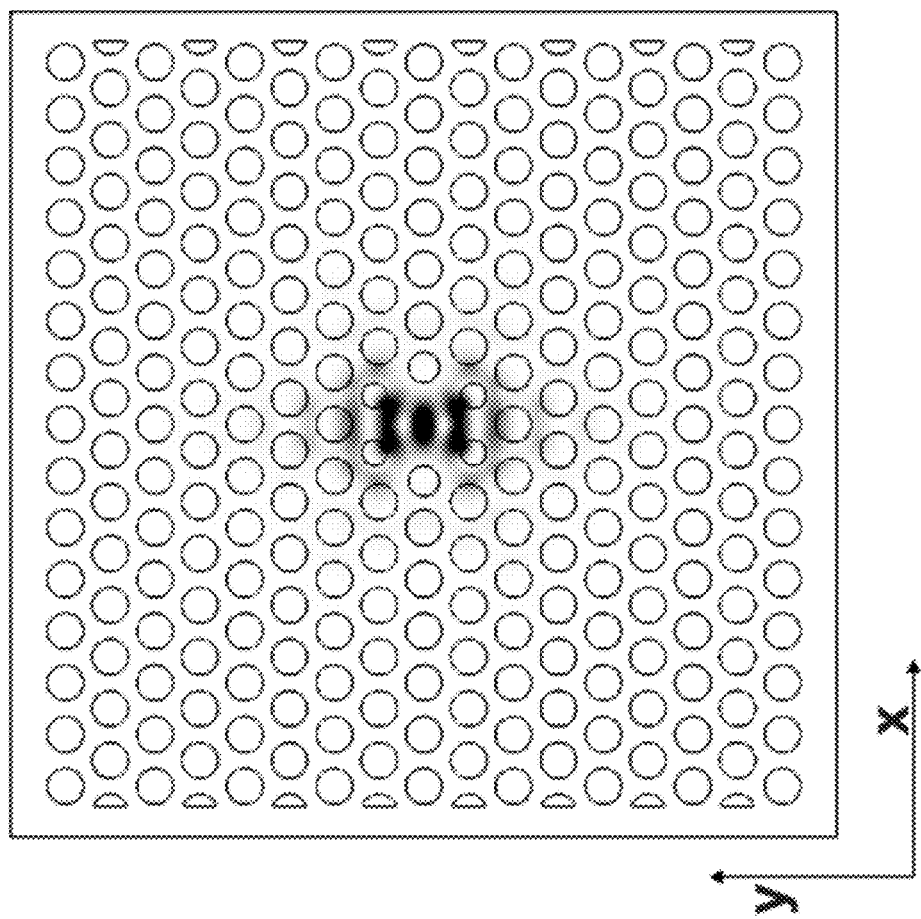
FIG. 2B shows an exemplary electric-field intensity plot for the resonant mode enabled by the structure shown in FIG. 2A.

With reference to FIG. 2A a top view of an exemplary photonic-crystal cavity design of the wafer structure (10) is shown. Periodically arranged air-holes (18) are formed in a semiconductor slab in which a quantum well active region is sandwiched by cladding layers on top and bottom. FIG. 2B shows an electric-field intensity plot for the resonant mode enabled by the wafer structure (10) shown in FIG. 2A.

Figure 3A:
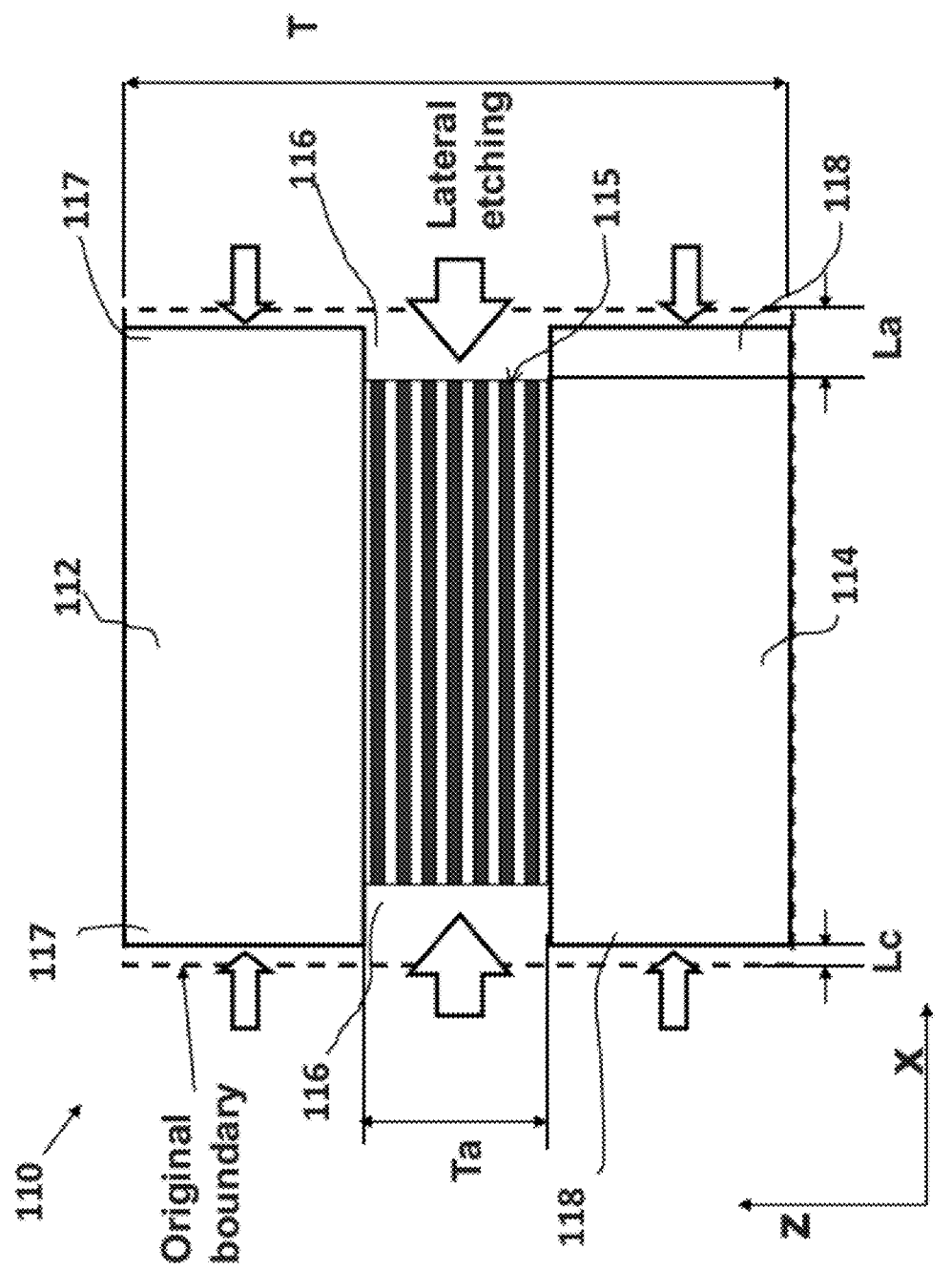
FIG. 3A shows a schematic sectional view of a wafer structure according to an embodiment of the present disclosure.

With reference to FIG. 3A, according to an aspect of the present disclosure, a wafer structure (110) that can contain a top cladding layer (112) and bottom cladding layer (114) is shown. The wafer structure (110) can include an intermediate layer (115), or medium layer, including multiple quantum well layers and their barrier layers. In particular, FIG. 3A shows a typical result of a wet-chemical etching method according to an embodiment of the present disclosure. The intermediate layer (115) of the wafer structure (110), shown in FIG. 3A, can have lateral recesses (116), which can define, on both sides of the wafer structure (110) right and left top protrusions (117) and right and left bottom protrusions (118).

In general, lateral etching distances in the cladding layers (112), (114) and the active layers (115), denoted by 'Lc' and 'La', respectively, can differ by their detailed layer compositions. Etch selectivity, 'S', between the active layer (115) and the cladding layer (112)(114) can be expressed in terms of the etch distances, such that S=La/Lc. The gap size between the two cladding layers (112), (114) is denoted by 'Ta'.

With reference to FIGS. 3B-3C, a scanning electron micrograph that shows lateral etching of a quantum well active region (215) is shown. The slab material is Indium Gallium Arsenide Phosphate (InGaAsP). The quantum well active region (215) of FIG. 3C can be laterally etched only on one side.

In addition, as anticipated above, a wet-etching technique can be combined with other well-established nanofabrication techniques to control the shape, size, and location of the active material with newly added functionality. The wafer structure (410) can include a hexagonal array of air-holes (photonic-crystal) defined in a semiconductor slab. It should be noted that this photonic-crystal pattern can be formed by using electron-beam lithography followed by ion-beam etching. The slab can be decomposed into top and bottom cladding layers and an active layer, as the structure shown in FIG. 1. In other words, with reference to FIGS. 4A-4B, a wafer structure (410) which can include an active layer (415) based on a two-dimensional photonic-crystal structure, which can be sandwiched between a top cladding layer (412) and a bottom cladding layer (414) is disclosed. The active layer (415) can be laterally etched, where the etched region can be initially confined on the peripheral zone of the active layer (415), comprised between peripheral zones of the top cladding layer (412) and the bottom cladding layer (414).

Figure 5A:
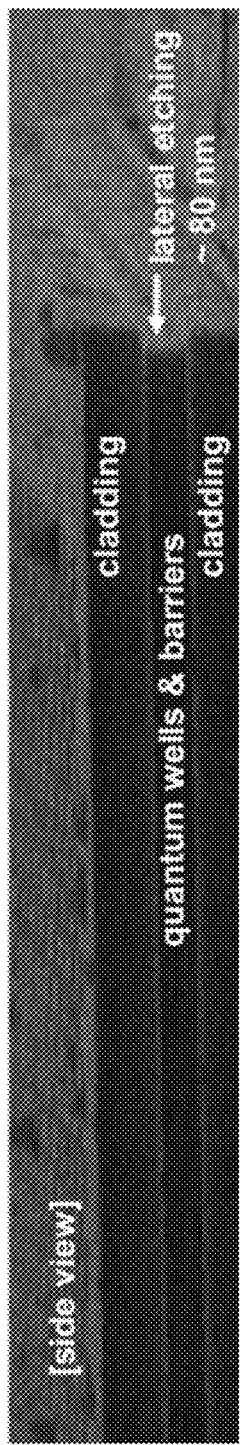
FIG. 5A shows a scanning electron micrograph that shows lateral etching of a quantum well active region.

Then, as the wet-chemical etching proceeds, the lateral etching of the active layer can leave an array of dot-like structures, which might function as the conventional quantum dot. Further wet-etching can completely remove the remaining quantum dot structures. To test this idea, a 600 nm-thick InGaAsP slab with photonic-crystal holes on it can be used. The same phosphoric acid based solution could be used for about 10 mins. From the side view as shown in FIG. 5A, the lateral etching distance of ~80 nm can be easily verified (the etched distance from the original outermost boundary can be estimated to be about 80 nm). From the tilted view shown in FIG. 5B, the smallest width from a vain-like region in the cladding layer appears to be about 120 nm. Since the wet-etching inside the hole propagates in all directions within the two-dimensionally confined gap region, the active region lying below the vain structure should be completely removed. Indeed, one can see the remaining active material through the hole opening, which may look like the schematic shown in FIG. 5C.

Figure 5C:
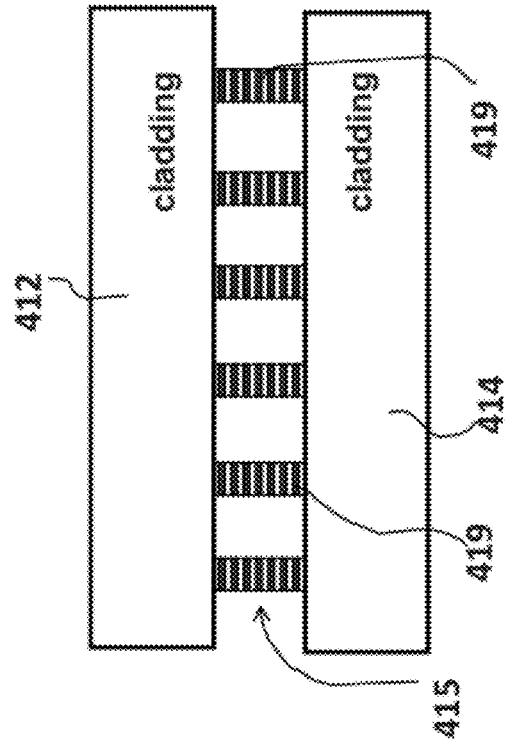
FIG. 5C shows a schematic cross-sectional view of the laterally etched structure shown in FIG. 5A and FIG. 5B.
Figure 5B:
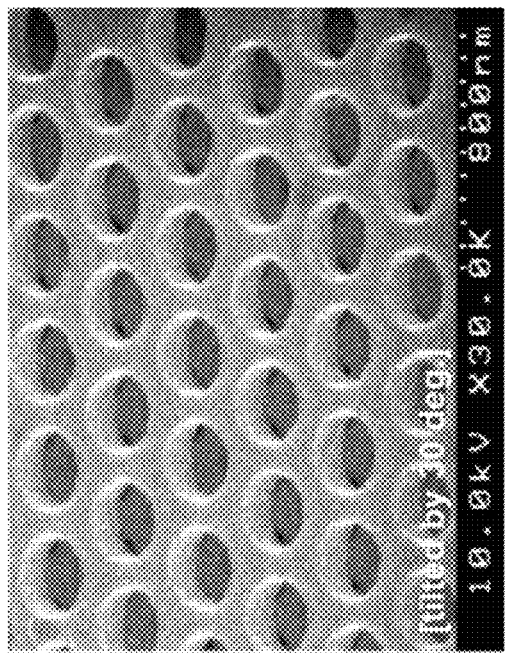
FIG. 5B shows a scanning electron micrograph of the same device shown in FIG. 5A, taken at a titled angle of 30 degrees.

In particular, looking at FIG. 5C, the active region (415) can include a plurality of walls, columns or piles (419), spaced apart from one another at regular distance and interposed between the top cladding layer (412) and the bottom cladding layer (414). Such walls, columns or piles (419) can define parallel channels in the structure (410).

Figure 6:
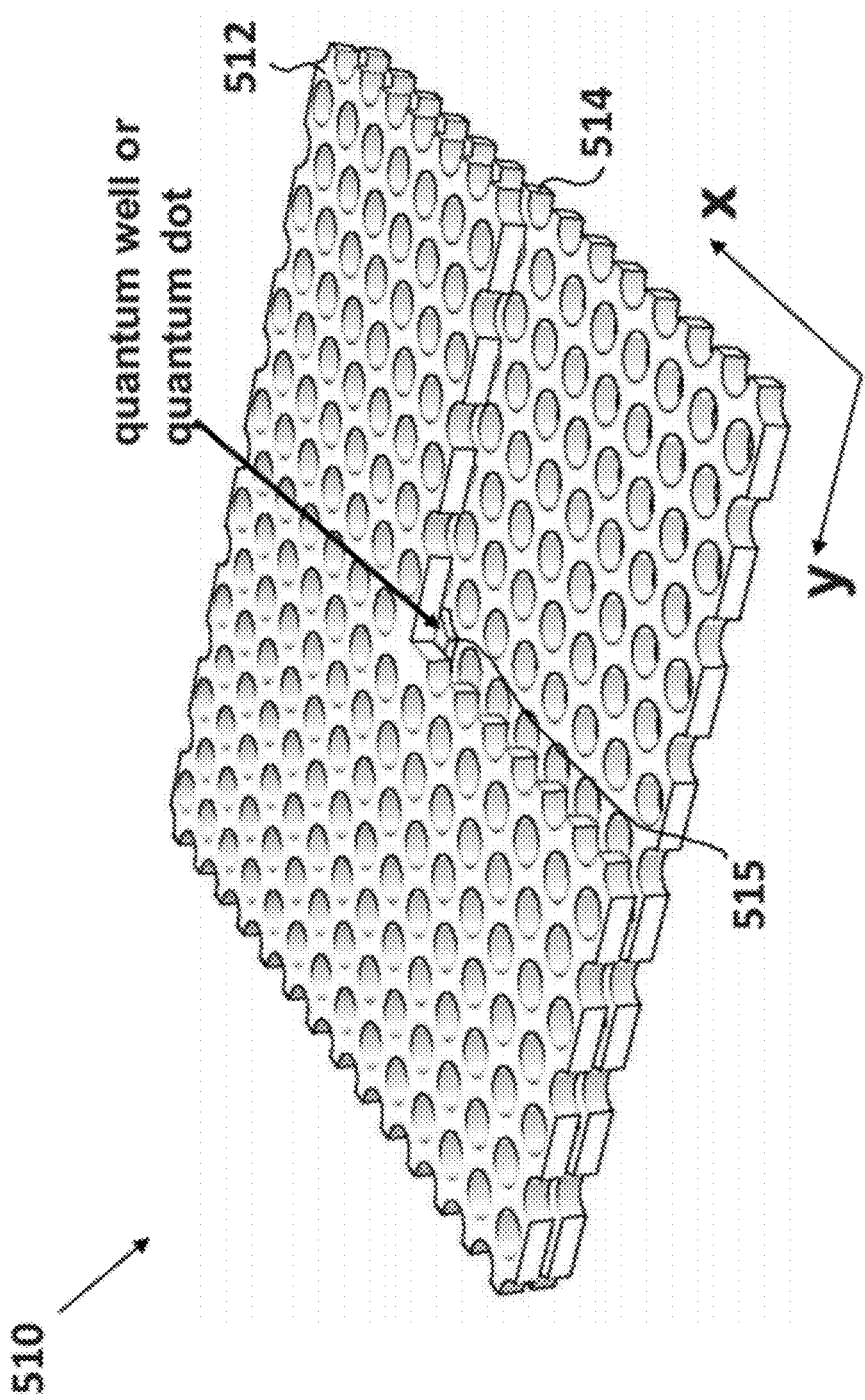
FIG. 6 shows a cross-sectional view of an exemplary etching result of a structure according to an embodiment of the present disclosure.

In addition, according to further aspects of the present disclosure, the method can be applied for any design with perforated holes and windows to offer unprecedented opportunity in the performance of active quantum nanostructures. For example, if the wet-etching were performed on the photonic-crystal structure shown in FIG. 2, one could get a small disk-like geometry (515) only in the vicinity of the defect resonator, as shown in FIG. 6. By adding more wet-etching, a quantum dot-like structure could be obtained as long as the two cladding layers were supported by other structures (not shown in FIG. 6). Isolation of an active region can be important when making electrically-pumped lasers, because this can enable current confinement. Moreover, this partitioning between an active region and a passive region will improve the performance of a nanolaser by quenching any unwanted re-absorption of light. More importantly, passive light-waveguides can be easily integrated on the same chip without relying on much more complex methods involving epitaxial re-growth, allowing efficient in and out coupling of light from the nanolaser.

In addition, according to further aspects of the present disclosure, the method also can be applied for lower dimensional photonic structures, such as one-dimensional photonic-crystals with or without a defect region as shown in FIGS. 7A-7B. The structure (610) shown in FIG. 7B is a nanobeam cavity, which is one of the classes in photonic-crystal resonators. In particular, the structure (610) of FIG. 7A can include an active layer (615), which can be sandwiched between a top cladding layer (612) end a bottom cladding layer (614). The active layer (615) can be laterally etched to obtain a plurality of regularly spaced walls, piles or columns. The structure (610) of FIG. 7B can include an active layer (615), which can be sandwiched between a top cladding layer (612) end a bottom cladding layer (614). The active layer (615) can be laterally etched to obtain a single intermediate active zone, for example a disc-shaped zone.

FIGS. 8A-8C summarize various possible geometries of active quantum nanostructures that can draw much attention in the near future and will be important for making current injection light emitting devices. When the lateral dimension of the etched nanostructures (710) is not in the quantum regime (as shown in FIG. 8A), the nanostructures (710) will essentially act as quantum wells. These structures can include an active layer (715), which can be sandwiched between a top cladding layer (712) and a bottom cladding layer (714). When the lateral dimension approaches about 20 nm, energy levels of confined electrons and holes within the active region (715) can be discretized due to the quantum confinement. FIGS. 8B and 8C show respective structures (810) (910), which can include an active layer (815) (915), which can be sandwiched between a top cladding layer (812), (912) and a bottom cladding layer (814), (914). The active layer can include vertically stacked quantum dots or single quantum dots (shaped as columns), that can be constructed by carefully controlled wet-etching. The lateral dimension of each confined quantum well structure is ~>100 nm. FIG. 8B shows vertically stacked multiple quantum dots that can be fabricated by the proposed wet-etching technique. The lateral dimension of each quantum dot, 'Wa', is about <20 nm.

Figure 9A:
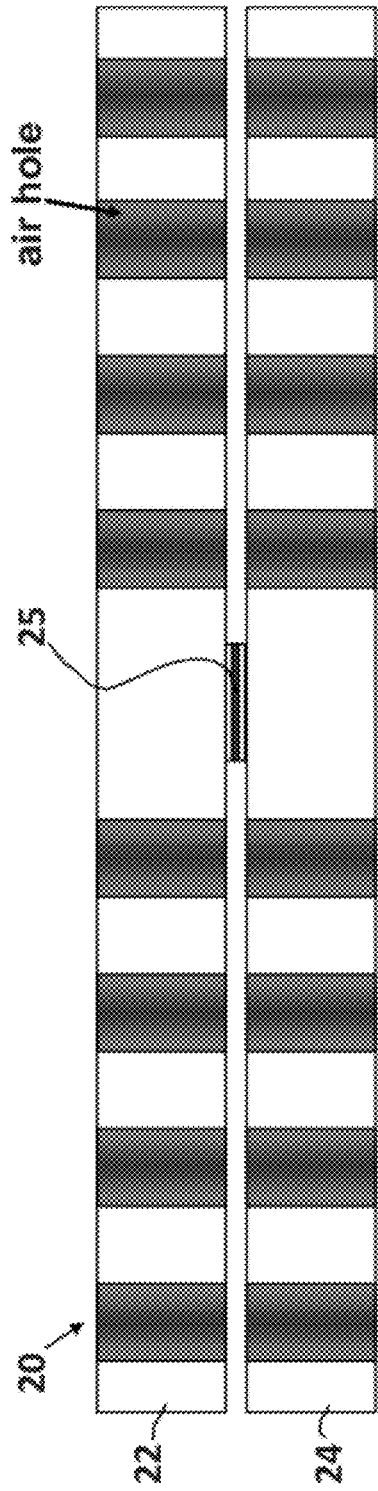
FIG. 9A shows a cross-sectional side view of a photonic crystal laser that may be optically pumped.
Figure 9B:
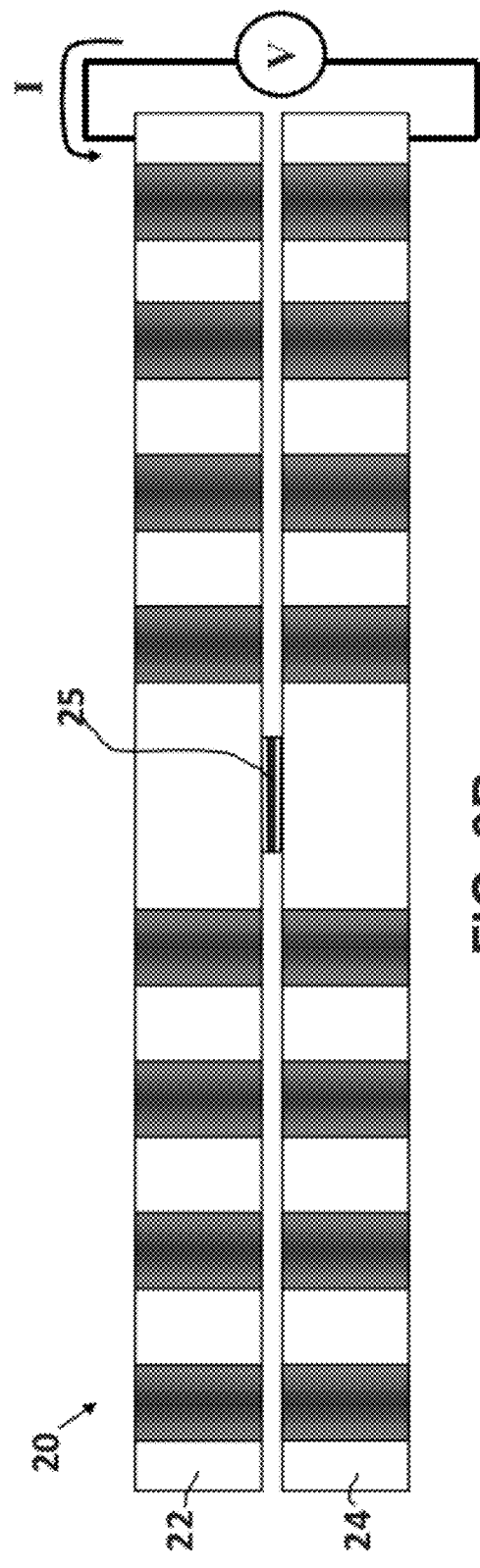
FIG. 9B shows a cross-sectional side view of a photonic crystal laser that may be electrically pumped.
Figure 11:
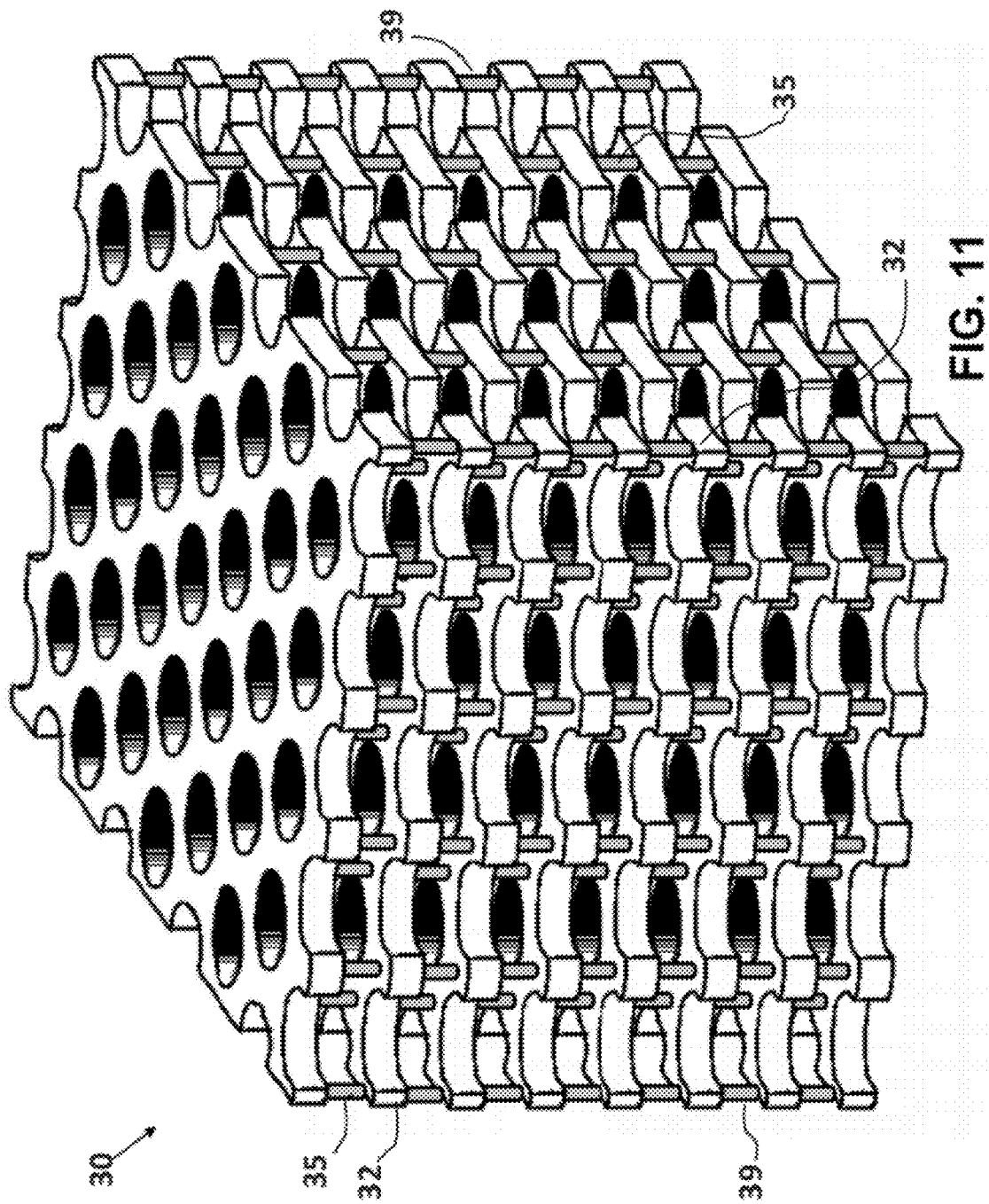
FIG. 11 shows a perspective view of 3-D photonic crystals according to an embodiment of the present disclosure.

FIGS. 9A-9B show vertical cross sectional images of photonic-crystal nanolasers (20), which may be either optically pumped (FIG. 9A) or electrically pumped (FIG. 9B). To achieve this goal, one may employ either two-dimensional photonic-crystal or one-dimensional photonic-crystal as a backbone structure. For current injection operation of the nanolaser (20), one may employ doped semiconductors for the top cladding (p or n) (22) and the bottom cladding (n or p) (24). The resultant gap size (Ta, in FIG. 3A) between the two cladding layers (22) (24) will be determined by the original thickness of an active layer (25). If single quantum well and two half barriers were used, the gap size could be as small as 20 nm. Such a thin active quantum structure can show quite low electrical resistance below 100Ω, which can be of a crucial design aspect of an electrically-pumped laser.

With reference to FIGS. 10A-10C and FIG. 11, 3-D photonic crystals are described. The 3-D photonic crystals can be obtained from a 1-D periodic structure (30) consisting of alternating layers of cladding (32) and sacrificial layers (35). Such a 1-D periodic structure (30) can be obtained by using usual wafer growth on an inert or cladding base (38). Then, an electron-beam lithography or photo lithography to define 2-D photonic crystal patterns in a resist layer (not shown in FIGS. 10A-10C) on the top surface of this device is performed. Then, these 2-D crystal patterns in the resist layer are transferred into the 1-D periodic structure by using dry-etching process such as chemically-assisted ion-beam etching, with the use of this resist layer as a mask. In particular, after this step, the structure (30) has alternating void spaces (37) and columns/walls (36) including said alternating layers of cladding (32) and sacrificial layers (35). Finally, selective wet-chemical etching is performed to 'partially' remove the sacrificial layers (35) sandwiched between cladding layers (32). The resulting structure (30) now appears to possess a certain 3-D symmetry whose vertical periodicity can be determined by the spacing between two adjacent cladding (or sacrificial) layers (32). According to this 3-D symmetry, spacing (39) is present in the structure (30) around the active layer (35) of each column/wall (36) between two adjacent layers of cladding (32), such that a portion of a top cladding layer (32) overlaps a corresponding portion of an adjacent bottom cladding layer (32) through said spacing (39).

Figure 12:
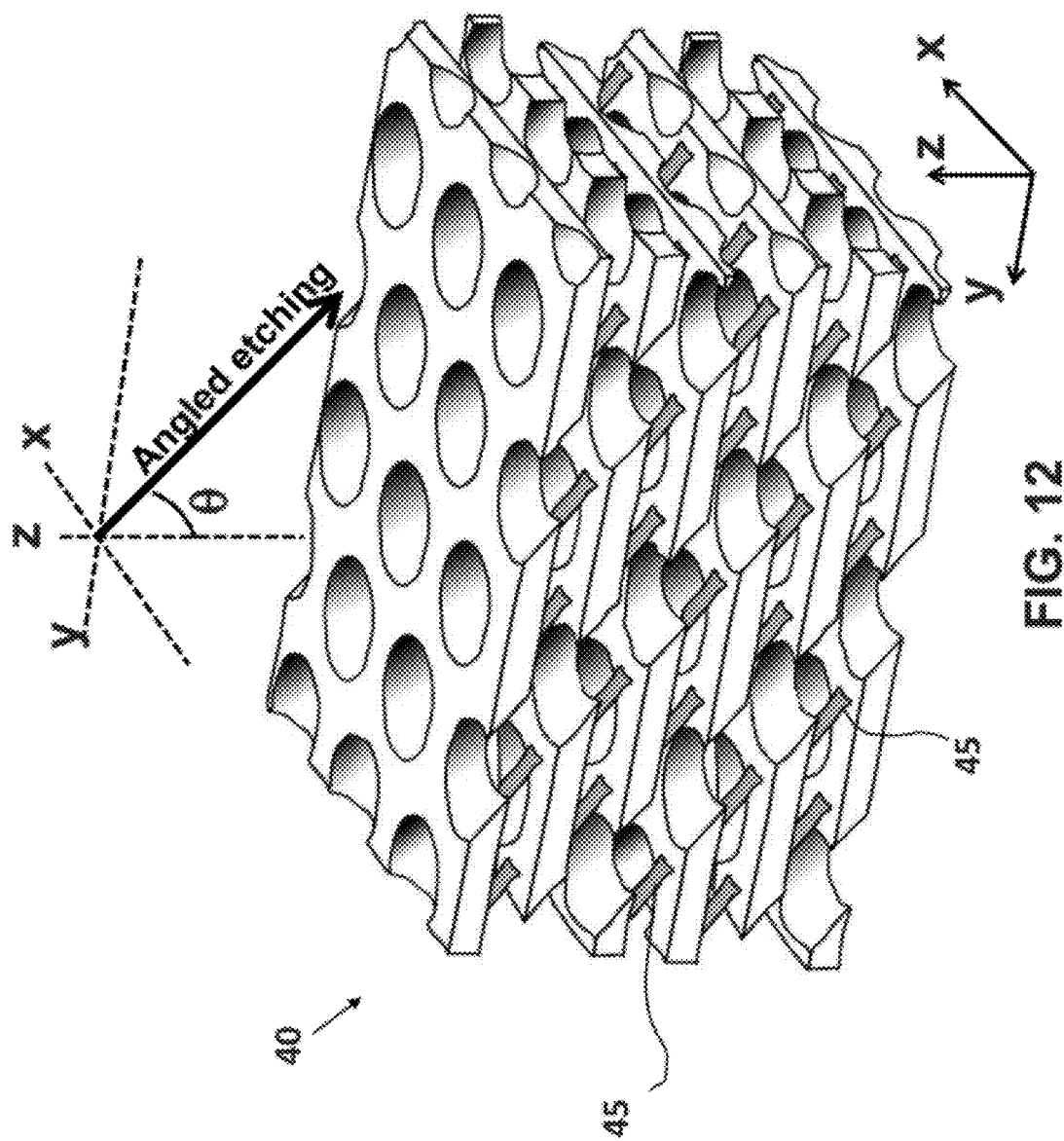
FIG. 12 shows a perspective view of 3-D photonic crystals according to an embodiment of the present disclosure.
Figure 13:
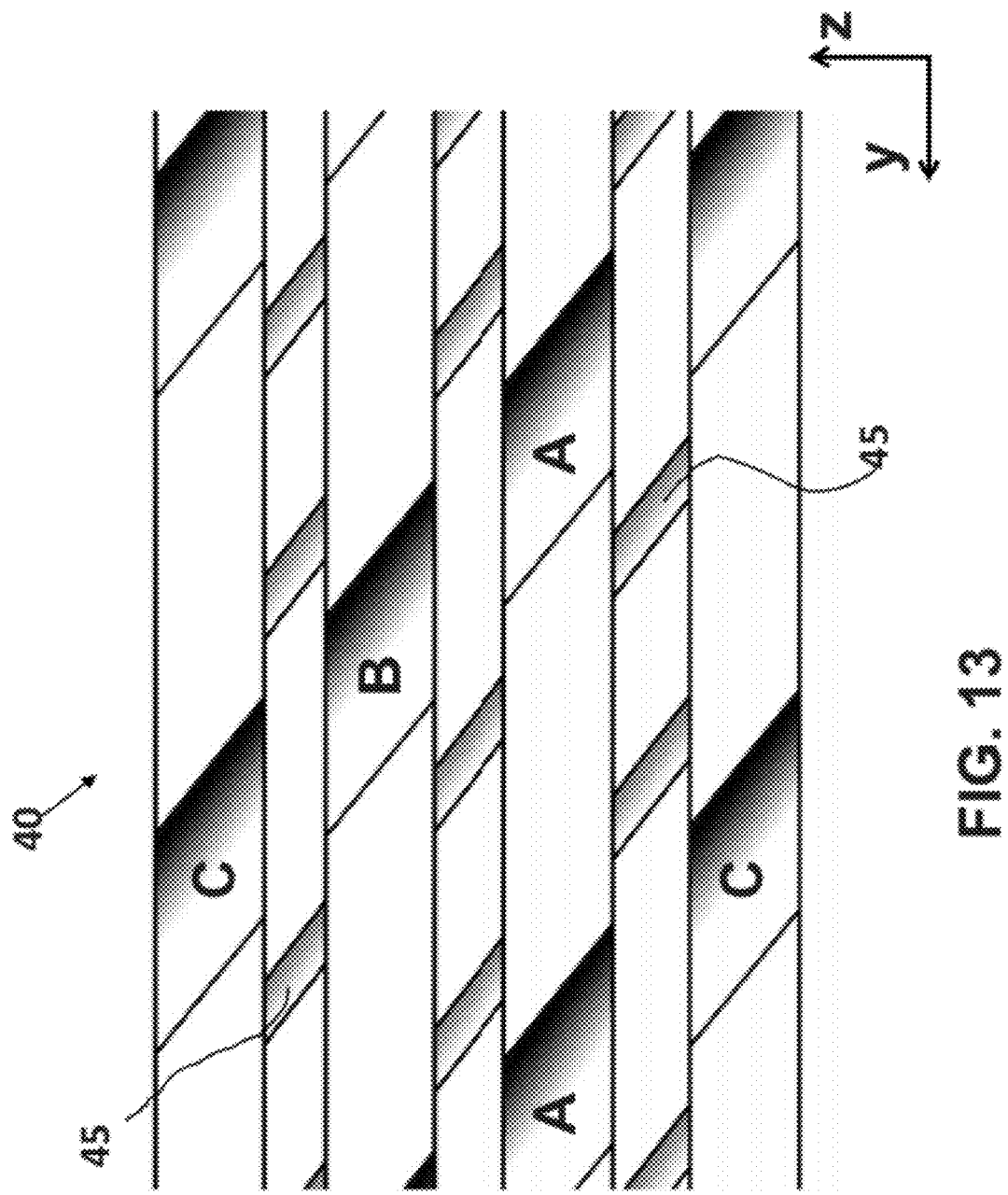
FIG. 13 shows an enlarged perspective view of 3-D photonic crystals of FIG. 12.
Figure 14:
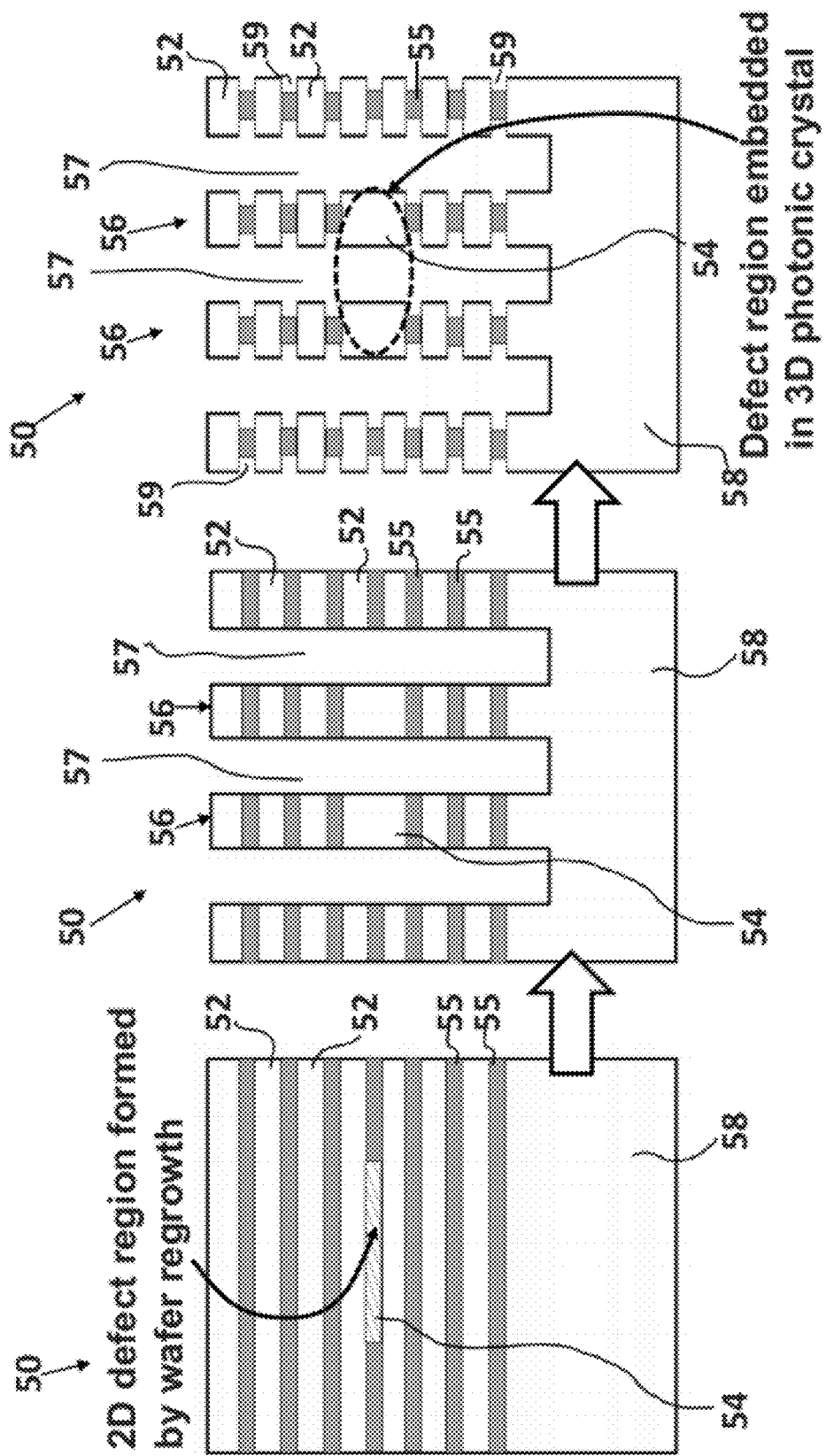
FIGS. 14A-14C shows fabrication steps of 3-D photonic crystals according to an embodiment of the present disclosure.

In the previously described method, the highly anisotropic dry-etching is performed, 'vertically', from the top to the bottom. With reference to FIGS. 12 and 13, it is shown how 3-D photonic crystals with fcc symmetry can be obtained by employing one-step 'angled' dry-etching, as depicted in FIGS. 12 and 13. The fabrication process can be performed according to the following steps. At first, a 1-D periodic structure (40) is prepared, where the vertical periodicity is denoted by 'az'. Second, a 2-D photonic crystal pattern (45) arranged in the triangular lattice is defined, where the lattice constant (hole-to-hole distance) could be chosen to be az*sqrt(3/2). Third, a one-step angled dry-etching as shown in FIGS. 12 and 13 is performed, at an angle of θ=35.3° [tan θ=1/sqrt(2)] away from normal. Then, a stacking sequence can be repeated every four layers as depicted in FIGS. 12 and 13, where void regions denoted by 'A', 'B', and 'C' correspond to basis atoms in the fcc crystal.

Finally, it is shown how one can create a defect region within 3-D photonic crystals. One example method according to further aspects of the present disclosure is described in FIGS. 14A-14C. In particular, during the initial wafer growth procedure, it is possible to insert a defect region (54) in one or few sacrificial layers by employing wafer regrowth method. This region may be designed to show different etching selectivity (either higher or lower selectivity) with respect to the original sacrificial layer. Therefore, after the final wet-chemical etching process, this region will remain (or will be completely removed) forming a naturally embedded defect structure in a 3-D photonic crystal. More in particular, with reference to FIGS. 14A-14C, a 1-D periodic structure (50) can be obtained by using usual wafer growth on an inert or cladding base (58). Then, an electron-beam lithography or photo lithography followed by highly anisotropic dry-etching is performed to define 2-D photonic crystal patterns on the top surface of this device. In particular, after this step, the structure (50) has alternating void spaces (57) and columns (56) of said alternating layers of cladding (52) and sacrificial layers (55). Finally, selective wet-chemical etching is performed to 'partially' remove the sacrificial layers (55) sandwiched between cladding layers (52). The resulting structure (50) now appears to possess a certain 3-D symmetry whose vertical periodicity can be determined by the spacing (59) between two adjacent cladding (or sacrificial) layers (52). In other words, according to this 3-D symmetry, spacing (59) is present in the structure (50) around the active layer (55) of each column/wall (56) between two adjacent layers of cladding (52), such that a portion of a top cladding layer (52) overlaps a corresponding portion of an adjacent bottom cladding layer (52) through said spacing (59).

With reference to FIGS. 15A-21, a photonic crystal slab according to further embodiments of the present disclosure is disclosed. In particular, according to some aspects of the present disclosure, the inventors have reversed the traditional concept of using a 'thin' membrane as a photonic crystal slab. FIGS. 15C-15D show a slab (60) including two thin membranes (62) together to form a 'double' slab. The two membranes (62) can be spaced apart by means of a gap (63), where a gap distance between the slabs can be controlled by the thickness of a sacrificial layer (69) shown in FIGS. 17-18. When the gap distance is much smaller than a typical wavelength of light, the resultant behavior of light propagation within such a double slab (60) could be very much similar to the case of a 'thick' slab (61) (whose thickness is roughly two times the original thickness). If the thickness of one constituent slab is 0.5 a, where 'a' is denoted as the lattice constant of the photonic crystal (in other word, a hole-to-hole distance), the light propagation behavior will be much similar to that of a slab with T=1 a. It is noted that although the size of the band gap will decrease as the thickness of the slab (T) is increased, it is still possible to find a reasonable amount of photonic band gap even when T=1 a. The photonic band structures of the two cases in FIGS. 16A and 16B can be compared. In particular, FIG. 16A shows a double slab (60) with each slab's thickness of 0.5 a and FIG. 16B shows a single slab (61) with T=1.0 a.

As shown in FIG. 15C, it is further possible to insert active layers (65) (quantum wells or quantum dots) in each slab (62) (among two overlapping layers (62a), (62b)), which will provide enough gain for lasing. It is further possible to form the gap region sandwiched by the two slabs (62) by using selective wet-chemical etching. However, this wet-chemical etching process has to be ceased when an appropriate size of the current aperture structure is left. Such left structure is denoted with reference number (69) in FIGS. 17A-17B.

Figure 18:
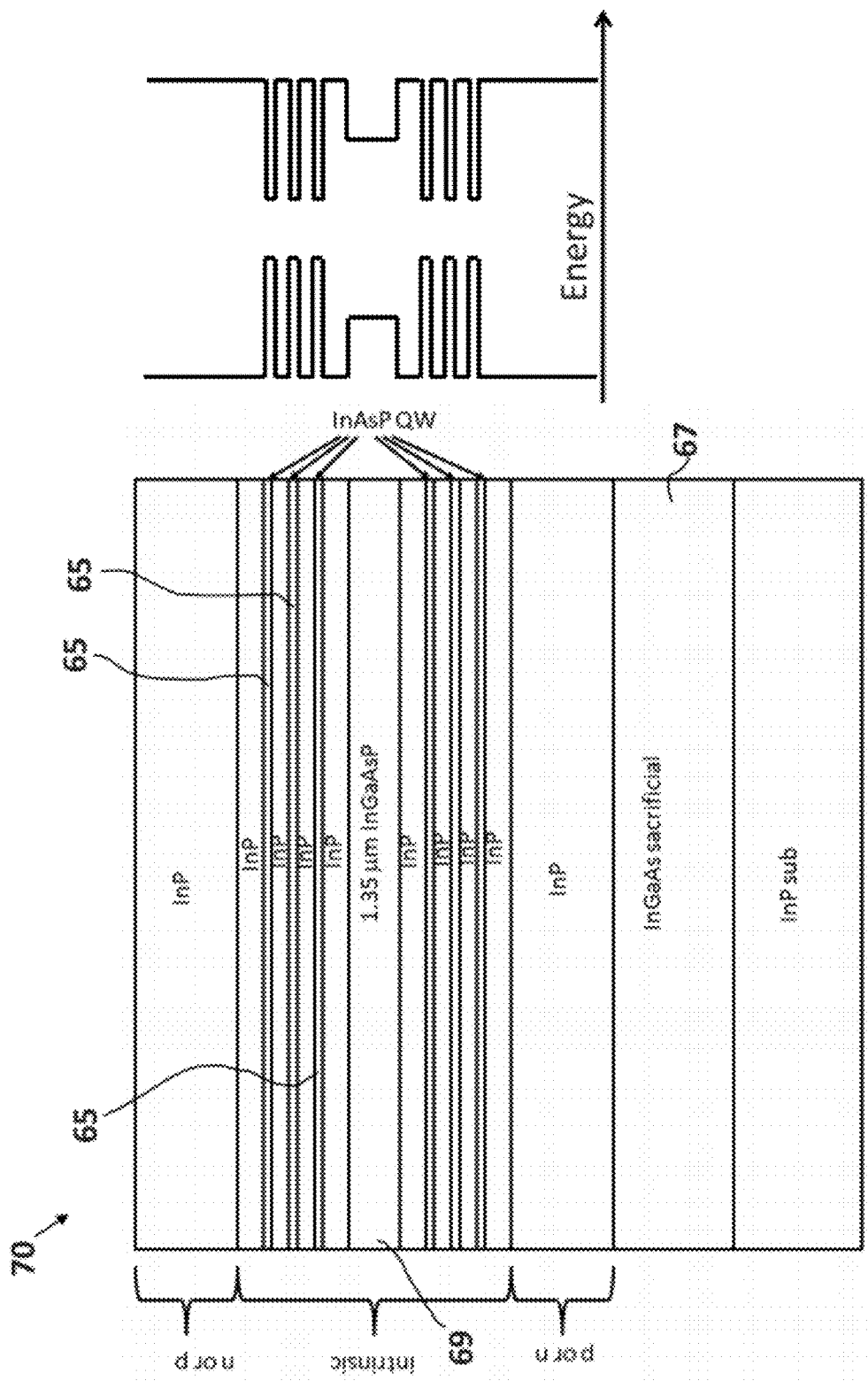
FIG. 18 shows an exemplary wafer design for a laser device emitting at 1.55 µm.

For example, for making lasers working at 1.55 µm, an exemplary wafer structure (70) is disclosed in FIG. 18. Basically, three multiple quantum wells (InAsP) were inserted within each slab (InP) and the two slabs are separated by the 1.35 µm InGaAsP sacrificial layer (69). For example, the InGaAsP sacrificial layer (69) can be selectively wet-etched by $H_3PO_4:H_2O_2:H_2O=1:1:10$ solution. It has been found that this etching is rather isotropic in the horizontal directions. Therefore, the current aperture can be formed at around the center of the cavity region in a self-aligned fashion.

According to further aspects of the present disclosure, it appears to be challenging to design a high-Q cavity mode based on such a thick slab because the size of the photonic band gap is not large. When T=0.5 a and the gap size is 0.15 a, it has been found that the band gap spans only from 0.265 to 0.290 in the unit of the normalized frequency ($=a/\lambda$) (See FIG. 16A). It should be noted that the band gap will be completely closed at T=0.6 a. Generally, it is desirable to locate a cavity resonance near to the center of the band gap by tuning a given cavity geometry. If there is a large enough band gap, this tuning process would not be critical for the design of a high-Q cavity mode. However, in most cases, the cavity Q can strongly depend on the same structural tuning. [8] This implies that the resulting Q will be limited by the restrictions on structural parameters due to the small band gap size.

Figure 19:
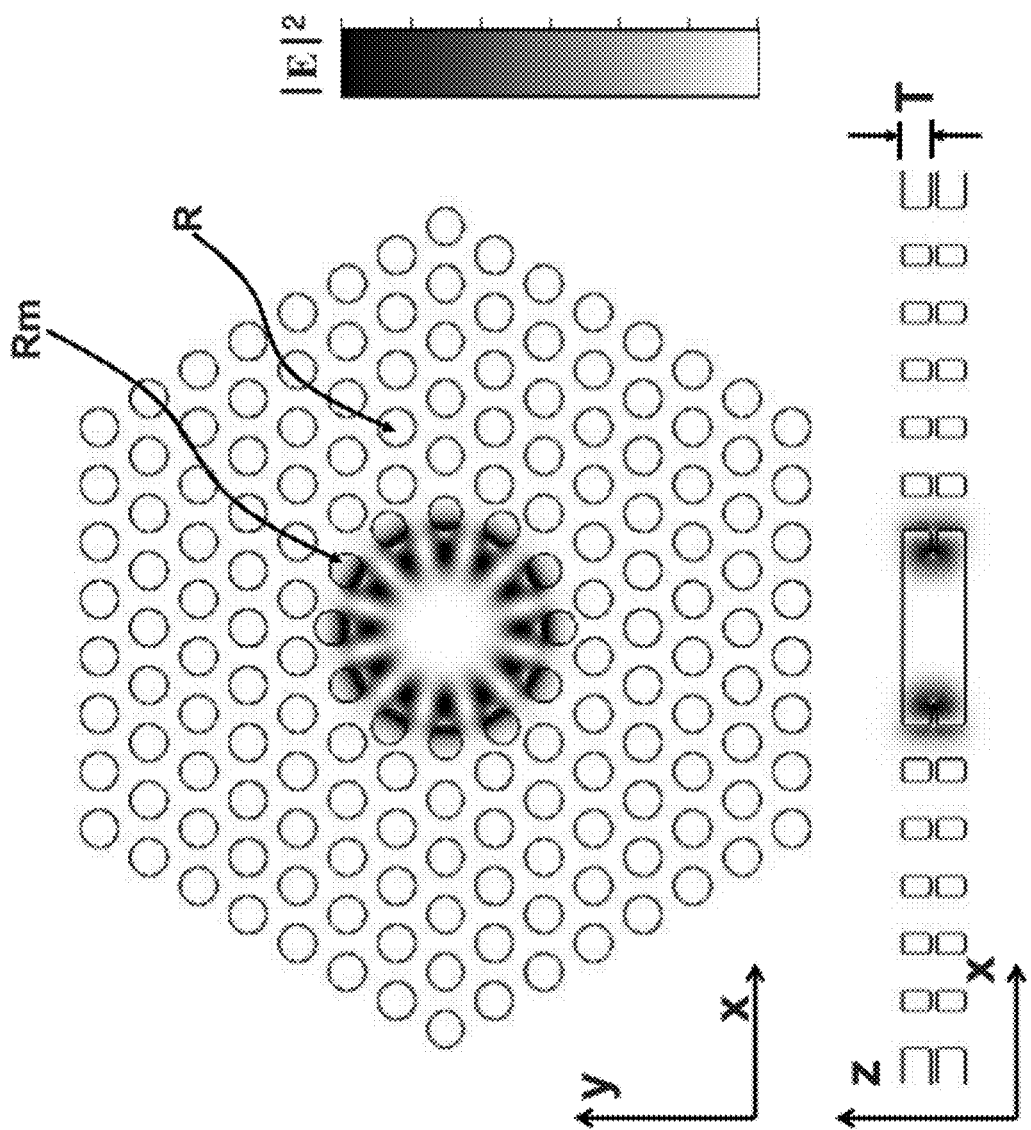
FIG. 19 shows an exemplary cavity design for a photonic crystal double-slab according to an embodiment of the present disclosure.
Figures 20A, 20B, 20C:
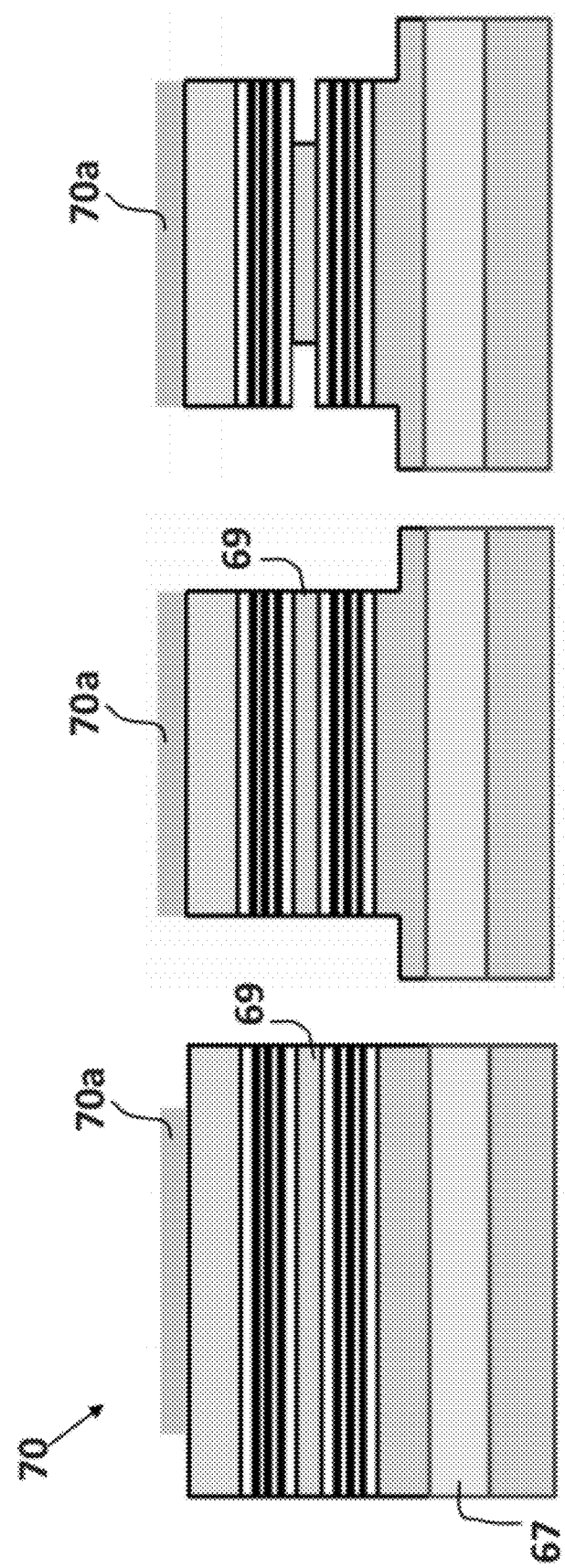
Figure 20F:
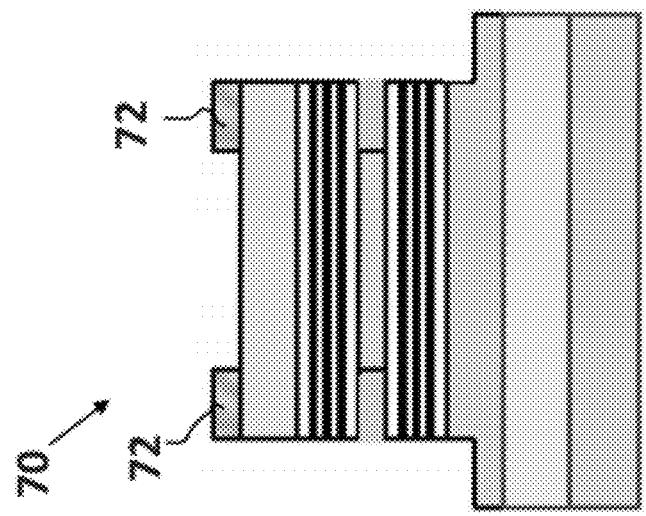
Figure 20E:
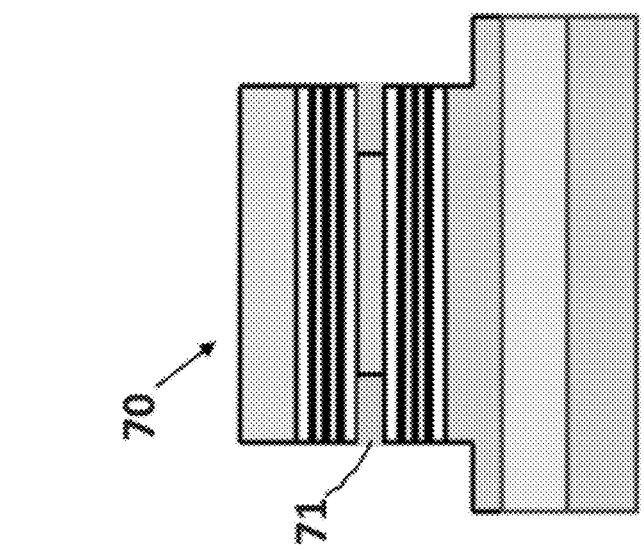
Figure 20D:
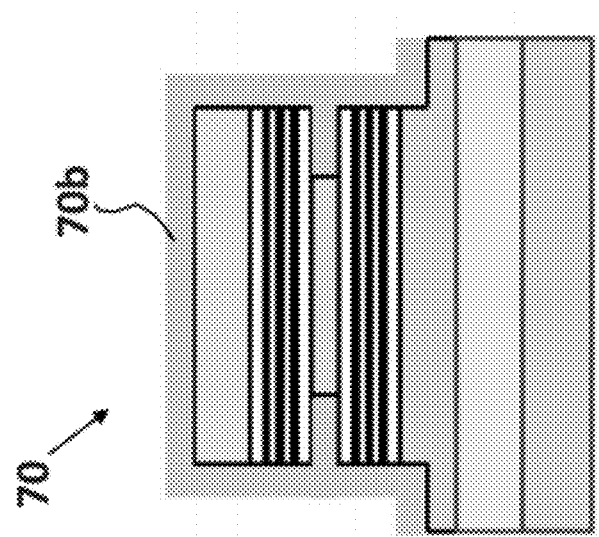

In particular, with reference to FIG. 19, an exemplary cavity design, so-called a 'dodecapole' mode, is shown, which was first proposed and theoretically analyzed by Ryu, et al. in 2004. [9] The resonance frequency of this dodecapole mode is a function of the nearest air-hole radii (Rm). However, it has been found that the resulting Q is not a strong function of Rm. Therefore, the cavity resonance can be safely located within the band gap while its Q can be maintained at some large value of 67,000 (theoretical). To center the resonance at around 1.55 µm, a can be chosen to be 425 nm. With this choice of a, the thickness of one constituent slab will be 212.5 nm (T=0.5 a), which is thick enough to form a mechanically robust double slab structure.

With reference to FIGS. 20A-20H, a fabrication sequence of double-slab photonic crystal laser (70) is shown according to some aspects of the present disclosure. The sequence can consist of two main steps, where a first step (illustrated in FIGS. 20A-20F) can use 'micro-fabrication' technologies based on a standard photolithography while a second step (illustrated in FIGS. 20G-20H) can intensively use 'nano-fabrication' technologies based on an electron-beam lithography.

In particular, the fabrication sequence can include a first step of mesa formation by micro-fabrication. The first step can include the following sub-steps:
(1) Standard photolithography is used in order to define an array of circular photo-resist (70a) (PR) masks on the wafer (70) (see FIG. 20A).
(2) A standard dry-etching for III-V material system is used in order to etch mesa structures. This dry etching should stop before the underlying InGaAs sacrificial layer is exposed (see FIG. 20B).
(3) $H_3PO_4:H_2O_2:H_2O=1:1:10$ solution is used in order to remove a part of the InGaAsP sacrificial layer (69), selectively over all the other parts. More than 3 µm lateral etching may be required. (see FIG. 20C)
(4) The etched gap region is refilled with PR (70b) by spin coating. (see FIG. 20D)
(5) Then, both the first PR (70a) and the second PR (70b) are removed by oxygen plasma treatment. During this process, the second PR 70b in the gap region will survive. It has been subsequently harden the PR in the gap by heating the resulting mesa at >250° C., thus obtaining a donut-shaped or annulus (ring)-shaped member (71). (see FIG. 20E)
(6) Standard photolithography and lift-off processes are further used in order place the top electrode (donut shaped), (72). (see FIG. 20F)

In addition, the fabrication sequence can include a second step of formation of a photonic crystal cavity by nano-fabrication. The second step can include the following sub-steps:

(7) Standard ebeam-lithography process is used to define photonic crystal patterns in ebeam resist. It is performed dry-etching to drill cylindrical air-holes. For 1.55 μm laser devices, it is expected that the required etching depth will be about >600 nm. The holes are indicated with reference numbers (75).

(8) Wet-chemical etching is performed to form a double slab and to undercut the InGaAs sacrificial layer. Finally, the resulting device is bond onto the bottom electrode (79).

Figure 21:
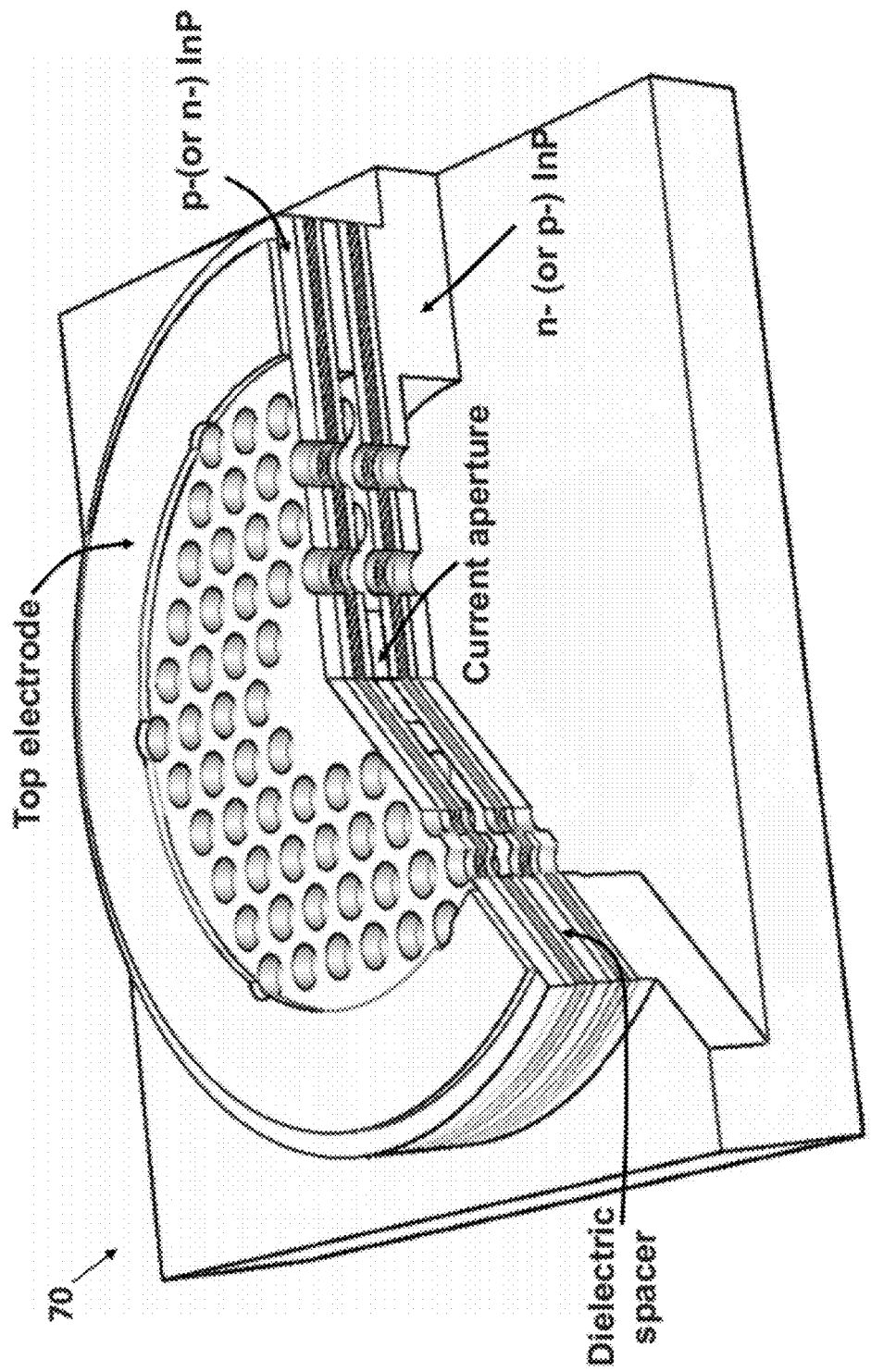
FIG. 21 shows a schematic diagram of a photonic crystal double-slab laser according to an embodiment of the present disclosure.

FIG. 21 shows a three-dimensional rendering of the proposed photonic crystal double slab laser.

The examples set forth above are provided to give those of ordinary skill in the art a complete disclosure and description of how to make and use the embodiments of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

LIST OF CITED REFERENCES

[1] H. G. Park, et al. "Electrically driven single-cell photonic crystal laser," Science Vol. 305, pp. 1444-1447 (2004).
[2] J. K. Jewel, et al. "Vertical-cavity surface-emitting lasers: Design, growth, fabrication, characterization," IEEE J. Quantum Electron., Vol. 27, pp. 1332-1346 (1991).
[3] M. K. Seo, et al. "Low threshold current single-cell hexapole mode photonic crystal laser," Appl. Phys. Lett., Vol. 90, 171122 (2007).
[4] B. Ellis, et al. "Ultralow-threshold electrically pumped quantum-dot photonic-crystal nanocavity laser," Nat. Photon., Vol. 5, pp. 297-300 (2011).
[5] O. Painter, et al. "Two-dimensional photonic band-gap defect mode laser," Science Vol. 284, pp. 1819-1821 (1999).
[6] J. D. Joannopoulos, et al. *Photonic crystals: Molding the flow of light* (Princeton University Press, second edition, 2008), pp. 135-139.
[7] S. G. Johnson, et al. "Guided modes in photonic crystal slab," Phys. Rev. B, Vol. 60, pp. 5751-5758 (1999).
[8] H. Y. Ryu, et al. "High-quality-factor and small-mode-volume hexapole modes in photonic-crystal-slab nano-cavities," Appl. Phys. Lett. Vol. 83, pp. 4294-4296 (2003).
[9] H. Y. Ryu, et al. "High quality-factor whispering-gallery mode in the photonic crystal hexagonal disk cavity," Opt. Express, Vol. 12, pp. 1708-1719 (2004).
[10] E. Yablonovitch, "Inhibited spontaneous emission in solid-state physics and electronics," Phys. Rev. Lett., Vol. 58, pp. 2059-2062 (1987).
[11] M. Maldovan and E. L. Thomas "Diamond-structured photonic crystals," Nat. Mater., Vol. 3, pp. 593-600 (2004).
[12] E. Yablonovitch, et al. "Photonic band structure: the face-centered-cubic case employing nonspherical atoms," Phys. Rev. Lett., Vol. 67, 2295-2298 (1991).
[13] S. Y. Lin, et al. "A three-dimensional photonic crystal operating at infrared wavelengths," Nature, Vol. 394, pp. 251-253 (1998).
[14] S. Noda, et al. "Full three-dimensional photonic bandgap crystals at near-infrared wavelengths," Science Vol. 289, pp. 604-606 (2000).
[15] S. Takahashi, et al. "Direct creation of three-dimensional photonic crystals by a top-down approach," Nat. Mater., Vol. 8, pp. 721-725 (2009).
[16] C. Luo, et al. "All-angle negative refraction in a three-dimensionally periodic photonic crystal," Appl. Phys. Lett., Vol. 81, pp. 2352-2354 (2002).
[17] D. R. Smith, et al. "Metamaterials and negative refractive index," Science, Vol. 305, pp. 788-792 (2004).

The invention claimed is:

1. A method of etching active quantum nanostructures, the method comprising:
providing a wafer structure including a first cladding layer and a second cladding layer, the wafer structure further comprising an intermediate active quantum nanostructure layer interposed between the first cladding layer and the second cladding layer; and
laterally etching the intermediate active quantum nanostructure layer on at least one side of the intermediate active quantum nanostructure layer selectively with respect to the first cladding layer and second cladding layer to define at least one lateral recess in the intermediate active quantum nanostructure layer and respective lateral protrusions of the first cladding layer and the second cladding layer protruding with respect to the intermediate active quantum nanostructure layer.

2. The method of claim 1, wherein the laterally etching is laterally wet chemically etching.

3. The method of claim 1, wherein the intermediate active quantum nanostructure layer is laterally etched on all sides to define a single central zone of the intermediate active quantum nanostructure layer.

4. The method of claim 1, wherein the wafer structure includes an array of air-holes defined in a semiconductor slab.

5. The method of claim 1, wherein the intermediate active quantum nanostructure layer is a two-dimensional photonic-crystal structure.

6. The method of claim 1, wherein as the lateral etching proceeds, the lateral etching of the intermediate active quantum nanostructure layer leaves an array of dot-like structures.

7. The method of claim 6, wherein further etching of intermediate active quantum nanostructure layer removes remaining quantum dot structures.

8. The method of claim 7, wherein after the further etching, the intermediate active quantum nanostructure layer is shaped as a plurality of columns or piles, spaced apart from one another at regular distance and interposed between the first cladding layer and the second cladding layer.

9. The method of claim 7, wherein after the further etching, the intermediate active quantum nanostructure layer is shaped as a disk interposed between the first cladding layer and the second cladding layer.

10. The method of claim 1, wherein the wafer structure includes one-dimensional photonic-crystals.

11. The method of claim 1, wherein the intermediate active quantum nanostructure layer includes quantum wells, vertically stacked quantum dots or single quantum dots.

12. The method of claim 1, wherein the laterally etching is laterally angled etching.

13. A wafer structure comprising:
a first cladding layer and a second cladding layer;
an intermediate active quantum nanostructure layer interposed between the first cladding layer and the second cladding layer; and
at least one laterally etched recess made on one side of the wafer structure in the region of the intermediate active quantum nanostructure layer, said lateral etched recess defining a lateral protrusion of the first cladding layer and a lateral protrusion of the second cladding layer protruding with respect to the intermediate active quantum nanostructure layer.

14. The wafer structure of claim 13, wherein the at least one laterally etched recess is a lateral wet-chemically etched recess.

15. The wafer structure of claim 13, wherein the structure includes a two-dimensional photonic-crystal or a one-dimensional photonic crystal as a backbone structure.

16. A method of creating three-dimensional photonic crystals, the method comprising:
providing a one-dimensional periodic structure including alternating layers of cladding and sacrificial layers;
performing lithography on a top surface of the one-dimensional periodic structure to define two-dimensional photonic crystal patterns, and to obtain a backbone structure including alternating void spaces and walls, each wall including said alternating layers of cladding and sacrificial layers; and
laterally etching at least one of said walls to partially remove the sacrificial layers sandwiched between two adjacent cladding layers and to obtain three-dimensional photonic crystals.

17. The method of claim 16, wherein the laterally etching is laterally wet-chemically etching.

18. The method of claim 16, wherein the laterally etching is laterally angled dry-etching.

19. The method of claim 16, wherein the one dimensional periodic structure includes an embedded defect structure.

20. Three-dimensional photonic crystals comprising a photonic crystal backbone structure including alternating void spaces and walls, each wall including alternating layers of cladding and sacrificial layers; the photonic crystal backbone structure further comprising laterally etched spacings in said sacrificial layers, wherein each laterally etched spacing surrounds a corresponding sacrificial layer, such that a portion of a top cladding layer overlaps a corresponding portion of an adjacent bottom cladding layer through said spacing.

21. A photonic crystal double slab comprising two photonic crystal membranes, the two photonic crystal membranes overlapping one another and being spaced apart by means of an intermediate gap, wherein at least one of the two photonic crystal membranes include at least one intermediate active quantum nanostructure layer.

22. A photonic crystal double slab comprising:
two photonic crystal membranes, the two photonic crystal membranes overlapping one another and being spaced apart by means of an intermediate gap; and
a current aperture structure between the two photonic crystal membranes,
wherein said intermediate gap is a lateral wet-chemically etched recess made in a sacrificial layer interposed between the two photonic crystal membranes.

23. A photonic crystal laser comprising a photonic crystal double slab comprising two photonic crystal membranes, the two photonic crystal membranes overlapping one another and being spaced apart by means of an intermediate gap, wherein the photonic crystal double slab defines p-i-n or n-i-p doped layers.

24. A method of fabricating a photonic crystal laser comprising:
providing two photonic crystal membranes, the two photonic crystal membranes overlapping one another;
interposing a sacrificial active quantum nanostructure between the two photonic crystal membranes;
laterally etching the sacrificial active quantum nanostructure to define a gap between the two photonic crystal membranes via microfabrication technologies;
depositing top electrodes using photolithography; and
etching holes through the two photonic crystal membranes using nano-fabrication technologies based on an electron-beam lithography.

* * * * *